United States Patent
Wu et al.

(10) Patent No.: US 12,464,896 B2
(45) Date of Patent: Nov. 4, 2025

(54) DISPLAY PANEL WITH STORAGE CAPACITOR HAVING DIFFERENT CARRIER MOBILITY REGIONS AND DISPLAY DEVICE

(71) Applicant: BOE Technology Group Co., Ltd., Beijing (CN)

(72) Inventors: Qian Wu, Beijing (CN); Longfei Fan, Beijing (CN); Pengcheng Lu, Beijing (CN); Xiaochuan Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 790 days.

(21) Appl. No.: 17/628,671

(22) PCT Filed: Feb. 23, 2021

(86) PCT No.: PCT/CN2021/077488
§ 371 (c)(1),
(2) Date: Jan. 20, 2022

(87) PCT Pub. No.: WO2022/178670
PCT Pub. Date: Sep. 1, 2022

(65) Prior Publication Data
US 2022/0344428 A1   Oct. 27, 2022

(51) Int. Cl.
*H10K 59/121* (2023.01)
*H10K 59/131* (2023.01)

(52) U.S. Cl.
CPC ..... *H10K 59/1216* (2023.02); *H10K 59/1213* (2023.02); *H10K 59/131* (2023.02)

(58) Field of Classification Search
CPC ........... H10K 59/1216; H10K 59/1213; H10K 59/131
See application file for complete search history.

(56) References Cited

U.S. PATENT DOCUMENTS 6,580,657 B2   6/2003   Sanford et al.
6,777,712 B2   8/2004   Sanford et al.
(Continued)

FOREIGN PATENT DOCUMENTS

CN   1543637 A   11/2004
CN   101211535 A   7/2008
(Continued)

OTHER PUBLICATIONS

Rabaey Jan: "Low Power Design Essentials", Apr. 21, 2009 (Apr. 21, 2009), XP093038286, ISBN: 978-0-387-71712-8 Retrieved from the Internet: URL:https://picture.iczhiku.com/resource/eetop/sHKRTzqQpjGJtmbx.pdf, [retrieved on Apr. 11, 2023], * p. 93-p. 94 *, 15 total pages.
(Continued)

*Primary Examiner* — Lex H Malsawma
*Assistant Examiner* — Bruce R. Smith
(74) *Attorney, Agent, or Firm* — Westman, Champlin & Koehler, P.A.

(57) ABSTRACT

A display panel and a display device, the display panel includes a sub-pixel, wherein the sub-pixel includes a pixel circuit and a light emitting element, the pixel circuit includes a data writing sub-circuit, a storage sub-circuit and a driving sub-circuit. The storage sub-circuit includes a storage capacitor (Cst) including a first capacitor electrode and a second capacitor electrode, the second capacitor electrode includes a first region, a second region and a third region, a carrier mobility in the second region is different from a carrier mobility in the first and third regions, and an area of the second region is larger than an area of the first and third regions. The control electrode of the driving sub-circuit and the first capacitor electrode are disposed in the same layer and implemented as an integral structure.

20 Claims, 26 Drawing Sheets

(56) References Cited

U.S. PATENT DOCUMENTS

| | | |
|---|---|---|
| 7,898,509 B2 | 3/2011 | Iida et al. |
| 9,378,676 B2 | 6/2016 | Nomura |
| 9,666,129 B2 | 5/2017 | Nomura |
| 9,799,267 B2 | 10/2017 | Nomura |
| 10,833,065 B2 | 11/2020 | Hong |
| 10,943,953 B2 | 3/2021 | Karda et al. |
| 11,056,056 B2 | 7/2021 | Xuan et al. |
| 11,081,057 B2 | 8/2021 | Yamazaki |
| 11,710,456 B2 | 7/2023 | Yamazaki |
| 12,148,392 B2 | 11/2024 | Yamazaki |
| 2002/0084463 A1 | 7/2002 | Sanford et al. |
| 2003/0179626 A1 | 9/2003 | Sanford et al. |
| 2003/0205968 A1* | 11/2003 | Chae ............... H10K 59/127 313/500 |
| 2005/0145855 A1* | 7/2005 | Park ............... H01L 29/78621 438/22 |
| 2008/0158110 A1 | 7/2008 | Iida et al. |
| 2009/0315918 A1 | 12/2009 | Minami et al. |
| 2012/0249516 A1 | 10/2012 | Wacyk et al. |
| 2012/0313118 A1 | 12/2012 | Wacyk et al. |
| 2015/0009105 A1 | 1/2015 | Nomura |
| 2015/0144892 A1* | 5/2015 | Chang ............... H10K 59/1213 257/40 |
| 2015/0366026 A1* | 12/2015 | Nebon ............... G09G 3/3233 315/291 |
| 2016/0012761 A1* | 1/2016 | Gai ............... H10K 59/351 345/694 |
| 2016/0267840 A1 | 9/2016 | Nomura |
| 2017/0169762 A1 | 6/2017 | Nomura |
| 2018/0006097 A1* | 1/2018 | Xiong ............... H10K 59/123 |
| 2019/0067375 A1 | 2/2019 | Karda et al. |
| 2019/0386001 A1 | 12/2019 | Hong |
| 2020/0105196 A1 | 4/2020 | Xuan et al. |
| 2020/0119126 A1 | 4/2020 | Jo et al. |
| 2020/0302873 A1 | 9/2020 | Yamazaki |
| 2021/0183951 A1 | 6/2021 | Karda et al. |
| 2022/0028343 A1 | 1/2022 | Yamazaki |
| 2024/0038178 A1 | 2/2024 | Yamazaki |

FOREIGN PATENT DOCUMENTS

| | | |
|---|---|---|
| CN | 104282261 A | 1/2015 |
| CN | 107424569 A | 12/2017 |
| CN | 107505789 A | 12/2017 |
| CN | 109074765 A | 12/2018 |
| CN | 109754756 A | 5/2019 |
| CN | 111095567 A | 5/2020 |

OTHER PUBLICATIONS

Extended European search report for European Patent Application No. 21927117.8, dated Apr. 25, 2023, 11 pages.

Translation of the First Office Action for Chinese Application No. 202180000281.9, dated Oct. 2024, 18 pages.

* cited by examiner

DISPLAY PANEL WITH STORAGE CAPACITOR HAVING DIFFERENT CARRIER MOBILITY REGIONS AND DISPLAY DEVICE

CROSS REFERENCE TO RELATED APPLICATION(S)

This application is a Section 371 National Stage Application of International Application No. PCT/CN2021/077488, filed on Feb. 23, 2021, entitled "DISPLAY PANEL AND DISPLAY DEVICE", the contents of which is incorporated herein by reference in its entirety.

TECHNICAL FIELD

The present disclosure relates to a field of display technology, and in particular, to a display panel and a display device.

BACKGROUND

Micro OLED displays relate to a combination of OLED technology and CMOS technology, and are associated with cross-integration of optoelectronics industry and microelectronics industry, which promotes development of a new generation of micro display technology and also promotes researches and development of organic electronics on silicon and even molecular electronics on silicon.

Micro OLED displays have excellent display characteristics, such as high resolution, high brightness, rich colors, low drive voltage, fast response speed, and low power consumption, etc., and have broad development prospects.

SUMMARY

Some embodiments of the present disclosure provides a display panel, including: a base substrate and a sub-pixel on the base substrate, wherein the sub-pixel includes a pixel circuit and a light emitting element, the pixel circuit includes a data writing sub-circuit, a storage sub-circuit and a driving sub-circuit; wherein the data writing sub-circuit is configured to transmit a data signal to the storage sub-circuit in response to a control signal; wherein the driving sub-circuit includes a control electrode, a first electrode and a second electrode, the control electrode of the driving sub-circuit is coupled to the storage sub-circuit, the first electrode of the driving sub-circuit is configured to receive a first power source voltage, the second electrode of the driving sub-circuit is coupled to a first electrode of the light emitting element, and the driving sub-circuit is configured to drive the light emitting element to emit light in response to a voltage of the control electrode of the driving sub-circuit; wherein the storage sub-circuit includes a storage capacitor, the storage capacitor includes a first capacitor electrode and a second capacitor electrode opposite to the first capacitor electrode, the first capacitor electrode and the second capacitor electrode are respectively configured as a first terminal of the storage sub-circuit and a second terminal of the storage sub-circuit, the second capacitor electrode is located between the base substrate and the first capacitor electrode, the second capacitor electrode includes a first region, a second region and a third region that are arranged in a short side direction of the sub-pixel in sequence, a carrier mobility in the second region is different from a carrier mobility in the first region and a carrier mobility in the third region, and an area of the second region is larger than an area of the first region and an area of the third region; and wherein the control electrode of the driving sub-circuit and the first capacitor electrode are disposed in the same layer and implemented as an integral structure.

In some embodiments, the pixel circuit further includes a resistor, the resistor is connected in series between the second electrode of the driving sub-circuit and the first electrode of the light emitting element, the resistor and the driving electrode of the driving sub-circuit are disposed in the same layer and spaced from each other, and a resistivity of the resistor is higher than a resistivity of the control electrode of the driving sub-circuit.

In some embodiments, the data writing sub-circuit includes a transmission gate circuit, the transmission gate circuit includes a first data writing transistor and a second data writing transistor, each of the first data writing transistor and the second data writing transistor includes a gate electrode, a first electrode and a second electrode, the control signal includes a first control signal and a second signal; wherein the gate electrode of the first data writing transistor is configured to receive the first control signal, the gate electrode of the second data writing transistor is configured to receive the second control signal, the first electrode of the first data writing transistor is coupled to the first electrode of the second data writing transistor, and each of the first electrode of the first data writing transistor and the first electrode of the second data writing transistor is coupled to the first terminal of the storage sub-circuit and the control electrode of the driving sub-circuit, the second electrode of the first data writing transistor is coupled to the second electrode of the second data writing transistor, and each of the second electrode of the first data writing transistor and the second electrode of the second data writing transistor is configured to receive the data signal.

In some embodiments, the driving sub-circuit includes a driving transistor, a gate electrode of the driving transistor, a first electrode of the driving transistor, and a second electrode of the driving transistor are configured as the control electrode of the driving sub-circuit, the first electrode of the driving sub-circuit, and the second electrode of the driving sub-circuit, respectively.

In some embodiments, each of the first data writing transistor and the driving transistor is an N-type metal oxide semiconductor field effect transistor, and the second data writing transistor is a P-type metal oxide semiconductor field effect transistor.

In some embodiments, the transmission gate circuit and the driving transistor are respectively located on both sides of the storage capacitor in a first direction parallel to the base substrate.

In some embodiments, the resistor and the driving transistor are located on the same side of the storage capacitor in the first direction parallel to the base substrate.

In some embodiments, a minimum distance between a channel of the driving transistor and the first data writing transistor is greater than a minimum distance between the channel of the driving transistor and the second data writing transistor.

In some embodiments, a minimum distance between the resistor and the first data writing transistor is smaller than a minimum distance between the resistor and the second data writing transistor.

In some embodiments, in a second direction parallel to the base substrate and perpendicular to the first direction, the second data writing transistor and the first data writing transistor are arranged in sequence and the driving transistor and the resistor are arranged in sequence, wherein the second direction is the short side direction of the sub-pixel.

In some embodiments, the resistor has an elongated shape extending in the first direction, and the resistor is located on a side of the second electrode of the driving transistor away from the driving transistor.

In some embodiments, a width of the resistor is smaller than a width of one of the gate electrode of the first data writing transistor, the gate electrode of the second data writing transistor, and the gate electrode of the driving transistor.

In some embodiments, the gate electrode of the driving transistor, the gate electrode of the first data writing transistor, the gate electrode of the second data writing transistor, the first capacitor electrode, and the resistor are disposed in the same layer.

In some embodiments, the storage capacitor further includes a third capacitor electrode, the third capacitor electrode is located on a side of the first capacitor electrode away from the second capacitor electrode in a direction perpendicular to the base substrate, and the third capacitor electrode is coupled to the first region of the second capacitor electrode through a first via hole.

In some embodiments, an orthographic projection of the third capacitor electrode on the base substrate falls within an orthographic projection of the second capacitor electrode on the base substrate, and the orthographic projection of the third capacitor electrode on the base substrate partially overlaps with an orthographic projection of the first capacitor electrode on the base substrate.

In some embodiments, the display panel further includes a grounding line configured to couple the first region and the third region of the second capacitor electrode, so that the first region and the third region of the second capacitor electrode input a grounding voltage, the grounding line is located on a side of the third capacitor electrode away from the second capacitor electrode in the direction perpendicular to the base substrate, and an orthographic projection of the grounding line on the base substrate partially overlaps with the orthographic projection of the third capacitor electrode on the base substrate.

In some embodiments, the second data writing transistor and the first data writing transistor are disposed side by side along the second direction, and are arranged symmetrically with respect to a symmetric axis in the first direction.

In some embodiments, the display panel includes four said sub-pixels, and the four sub-pixels constitute a pixel unit group; wherein the four sub-pixels are arranged in a first direction and a second direction as an array, and the first direction is perpendicular to the second direction; and wherein orthographic projections of second data writing transistors of the four sub-pixels on the base substrate fall within one N-type well region in the base substrate.

In some embodiments, resistors of the sub-pixels adjacent in the first direction are arranged symmetrically with respect to a symmetric axis in the second direction, and resistors of the sub-pixels adjacent in the second direction are arranged symmetrically with respect to a symmetric axis in the first direction.

In some embodiments, transmission gate circuits of two sub-pixels adjacent in the first direction are arranged symmetrically with respect to a symmetric axis in the second direction, and transmission gate circuits of two sub-pixels adjacent in the second direction are arranged symmetrically with respect to a symmetric axis in the first direction.

In some embodiments, driving transistors of the two sub-pixels adjacent in the first direction are arranged symmetrically with respect to a symmetric axis in the second direction, and driving transistors of the two sub-pixels adjacent in the second direction are arranged symmetrically with respect to a symmetric axis in the first direction.

In some embodiments, first capacitor electrodes of the sub-pixels adjacent in the first direction are arranged symmetrically with respect to a symmetric axis in the second direction, and first capacitor electrodes of the sub-pixels adjacent in the second direction are arranged symmetrically with respect to a symmetric axis in the first direction.

In some embodiments, orthographic projections of the first capacitor electrodes of the four sub-pixels on the base substrate are located outside the N-type well region, and are disposed surrounding the N-type well region.

In some embodiments, a part of the third capacitor electrode close to the first region of the second capacitor electrode has a width in the first direction being greater than a width in the first direction of a part of the third capacitor electrode close to the third region of the second capacitor electrode.

In some embodiments, the sub-pixel further includes an anode via hole configured to connect the pixel circuit and the light emitting element, and an orthographic projection of the anode via hole on the base substrate at least partially overlaps with the orthographic projection of the first capacitor electrode on the base substrate.

In some embodiments, the sub-pixel further includes an anode via hole configured to connect the pixel circuit and the light emitting element, and an orthographic projection of the anode via hole on the base substrate at least partially overlaps with the orthographic projection of the third capacitor electrode on the base substrate.

In some embodiments, the pixel circuit further includes: a connecting electrode configured to couple the data writing sub-circuit and the first capacitor electrode of the storage capacitor, wherein the connecting electrode is coupled to the first capacitor electrode through a second via hole, and a distance between the second via hole and the first region is smaller than a distance between the second via hole and the third region.

In some embodiments, a distance between the first via hole and the driving transistor is smaller than a distance between the first via hole and the data writing sub-circuit.

In some embodiments, the orthographic projection of the first capacitor electrode on the base substrate and the orthographic projection of the second capacitor electrode on the base substrate have an overlapped region, and the overlapped region includes a first protrusion protruding toward the driving transistor and a second protrusion protruding toward the first data writing transistor.

The present disclosure further provides a display device, including the display panel described above.

BRIEF DESCRIPTION OF THE DRAWINGS

By reading the detailed description of the non-limiting embodiments with reference to the following drawings, other features, purposes and advantages of the present disclosure will become more apparent.

DETAILED DESCRIPTION OF EMBODIMENTS

Figure 1:
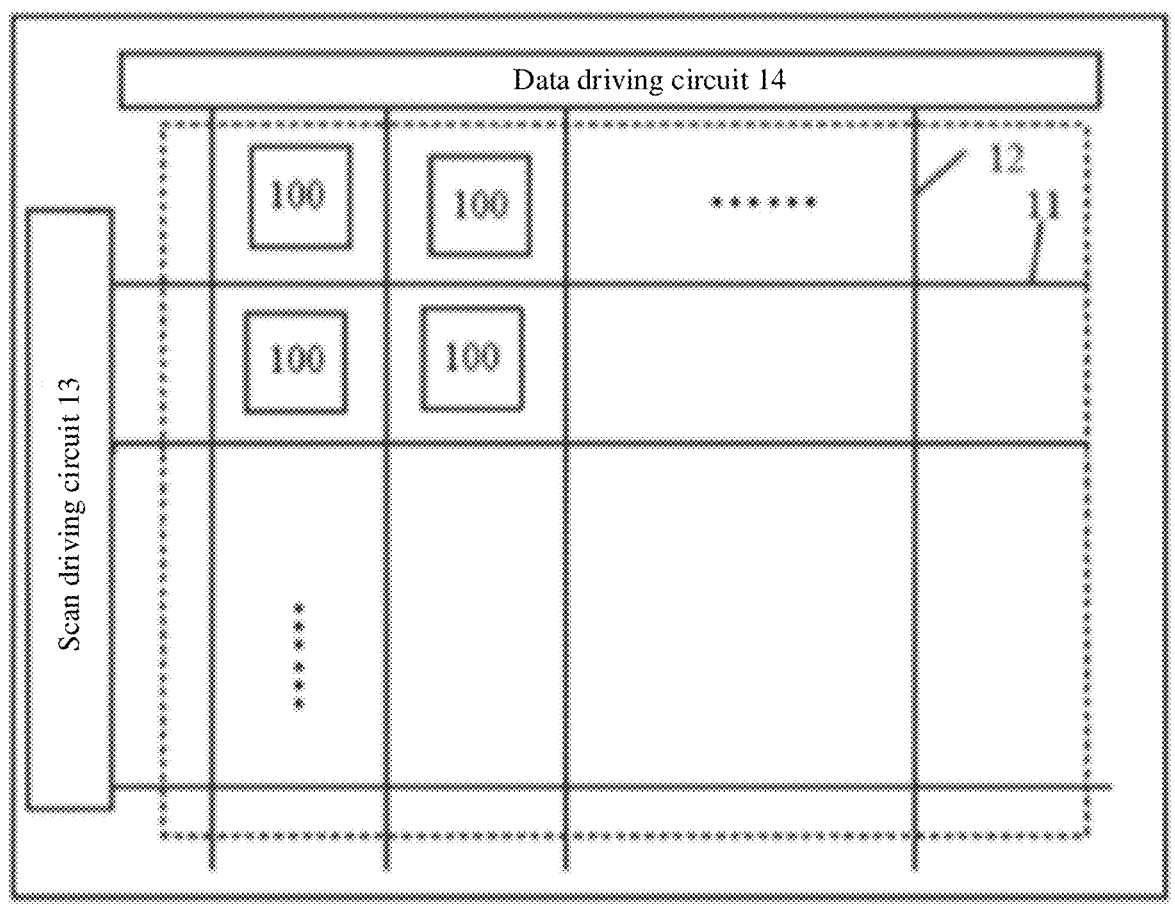
FIG. 1 is a block diagram of a display panel provided by some embodiments of the present disclosure.

The present disclosure will be further described in detail below with reference to the accompanying drawings and embodiments. It can be understood that the specific embodiments described here are only used to explain the related invention, but not to limit the present disclosure. In addition, it should be noted that, for ease of description, only parts related to the present disclosure are shown in the drawings.

It should be noted that the embodiments in the present disclosure and features in the embodiments may be combined with each other if there is no conflict.

In addition, in the following detailed description, for ease of explanation, many specific details are set forth to provide a comprehensive understanding of the embodiments of the present disclosure. However, obviously, one or more embodiments may also be implemented without these specific details.

It should be understood that, although terms first, second, etc. may be used herein to describe different elements, these elements should not be limited by these terms. These terms are only used to distinguish one element from another. For example, without departing from the scope of the exemplary embodiment, the first element may be named as the second element, and similarly, the second element may be named as the first element. The term "and/or" as used herein includes any and all combinations of one or more of the related listed items.

It should be understood that when an element or layer is referred to as being "formed on" another element or layer, the element or layer may be directly or indirectly formed on the other element or layer. That is, for example, there may be an intermediate element or an intermediate layer. In contrast, when an element or layer is referred to as being "directly formed on" another element or layer, there is no intermediate element or intermediate layer. Other terms used to describe the relationship between elements or layers should be interpreted in a similar manner (for example, "between" and "directly between", "adjacent" and "directly adjacent", etc.).

The terms used herein are only for purpose of describing specific embodiments, and are not intended to limit the embodiments. As used herein, unless the context clearly dictates otherwise, a singular form is also intended to include a plural form. It should also be understood that when terms "comprise" and/or "include" are used herein, it means that the described features, wholes, steps, operations, elements and/or components are present, but do not exclude a presence or addition of one or more other features, wholes, steps, operations, elements, components, and/or combinations thereof.

Herein, unless otherwise specified, the expressions "located in the same layer" and "arranged in the same layer" generally mean that the first component and the second component may be formed using one material and by one patterning process. The expressions "located on different layers" and "arranged on different layers" generally mean that the first component and the second component are formed by different patterning processes.

Herein, unless otherwise specified, the "coupling" of the first component and the second component means that there is a physical connection between the first component and the second component, so that there is an interaction of a signal, such as an electrical signal or a magnetic signal, between the two. A specific implementation manner of the signal interaction may include a direct electrical connection, and may also include connections through other electronic elements.

In the field of OLED display, with the rapid development of high-resolution products, higher requirements are put forward on a structural design of a display panel, such as an arrangement of pixels and signal lines. For example, as compared to an OLED display device with a resolution of 4K, the number of sub-pixel units that need to be disposed in an OLED display device with a large size and a resolution of 8K is doubled, and a pixel density is doubled accordingly. On one hand, a line width of the signal line becomes smaller, which causes the signal line's own resistance to become larger; on the other hand, an overlap between the signal lines becomes more, which causes a parasitic capacitance of the signal line to become larger, which causes a resistance-capacitance load of the signal line to become larger. Correspondingly, a signal delay (RC delay), a voltage drop (IR drop), and a voltage rise (IR rise) and other phenomena caused by the resistance-capacitance load will also become serious. These phenomena will seriously affect a display quality of a display product.

Micro OLED displays generally have a size less than 100 microns, such as a size less than 50 microns, etc. Micro OLED displays relate to a combination of OLED technology and CMOS technology, in which an OLED array is prepared on a silicon-based substrate including a CMOS circuit.

Micro OLEDs are widely used in AR and VR fields. With the continuous development of technology, higher resolution is required. Therefore, higher requirements are put forward on the structural design of the display panel, such as the arrangement of the pixels and the signal lines.

In the display panel provided by at least one embodiment of the disclosure, optimized layout and wiring is applied in designing, such that an area of sub-pixel being 5.45 μm×13.6 μm may be achieved, achieving a high resolution (PPI, Pixels Per Inch), an optimized arrangement of the pixel circuit array, and a better display effect.

FIG. 1 is a block diagram of a display panel provided by some embodiments of the present disclosure. As shown in FIG. 1, the display panel 10 includes a plurality of sub-pixels 100 arranged in an array, a plurality of scan lines 11 and a plurality of data lines 12. Each sub-pixel 100 includes a light-emitting element and a pixel circuit configured to drive the light-emitting element. The plurality of scan lines 11 and the plurality of data lines 12 cross each other to define a plurality of pixel regions that are arranged in an array in a display region, and a pixel circuit of a sub-pixel 100 is provided in each pixel region.

As shown in FIG. 1, the display panel may further include a scan driving sub-circuit 13 and a data driving sub-circuit 14 that are located in the non-display region. The scan driving sub-circuit 13 is connected to the pixel circuit through the scan line 11 to provide various control signals, such as a scan signal, and the data driving sub-circuit 14 is connected to the pixel circuit through the data line 12 to provide a data signal. The positional relationships between the scan driving sub-circuit 13 and the data driving sub-circuit 14, and between the scan line 11 and the data line 12 in the display panel shown in FIG. 1 are merely examples, and the actual arrangement position may be designed as desired.

In some embodiments, the display panel 10 may further include a control circuit. For example, the control circuit is configured to control the data driving circuit 14 to apply the data signal, and to control the scan driving sub-circuit 13 to apply the scan signal. An example of this control circuit is a timing control circuit (T-con). The control circuit may be in various forms, for example, including a processor and a memory. The memory includes an executable code, and the processor runs the executable code to execute the above method.

For example, the processor may be a central processing unit (CPU) or other form of processing device with data processing capability and/or instruction execution capability, for example, it may include a microprocessor, a programmable logic controller (PLC), and the like.

For example, the storage device may include one or more computer program products, and the computer program products may include various forms of computer-readable storage media, such as a volatile memory and/or a non-volatile memory. The volatile memory may include, for example, a random access memory (RAM) and/or a cache memory (cache), etc. The non-volatile memory may include, for example, a read-only memory (ROM), a hard disk, a flash memory, and the like. One or more computer program instructions may be stored on a computer-readable storage medium, and the processor may execute functions expected by the program instructions. Various application programs and various data may also be stored in the computer-readable storage medium.

The pixel circuit may include a driving sub-circuit, a data writing sub-circuit, and a storage sub-circuit as required, and may also include a compensation sub-circuit, a light emission control sub-circuit, a reset circuit, etc., as required.

Figure 2A:
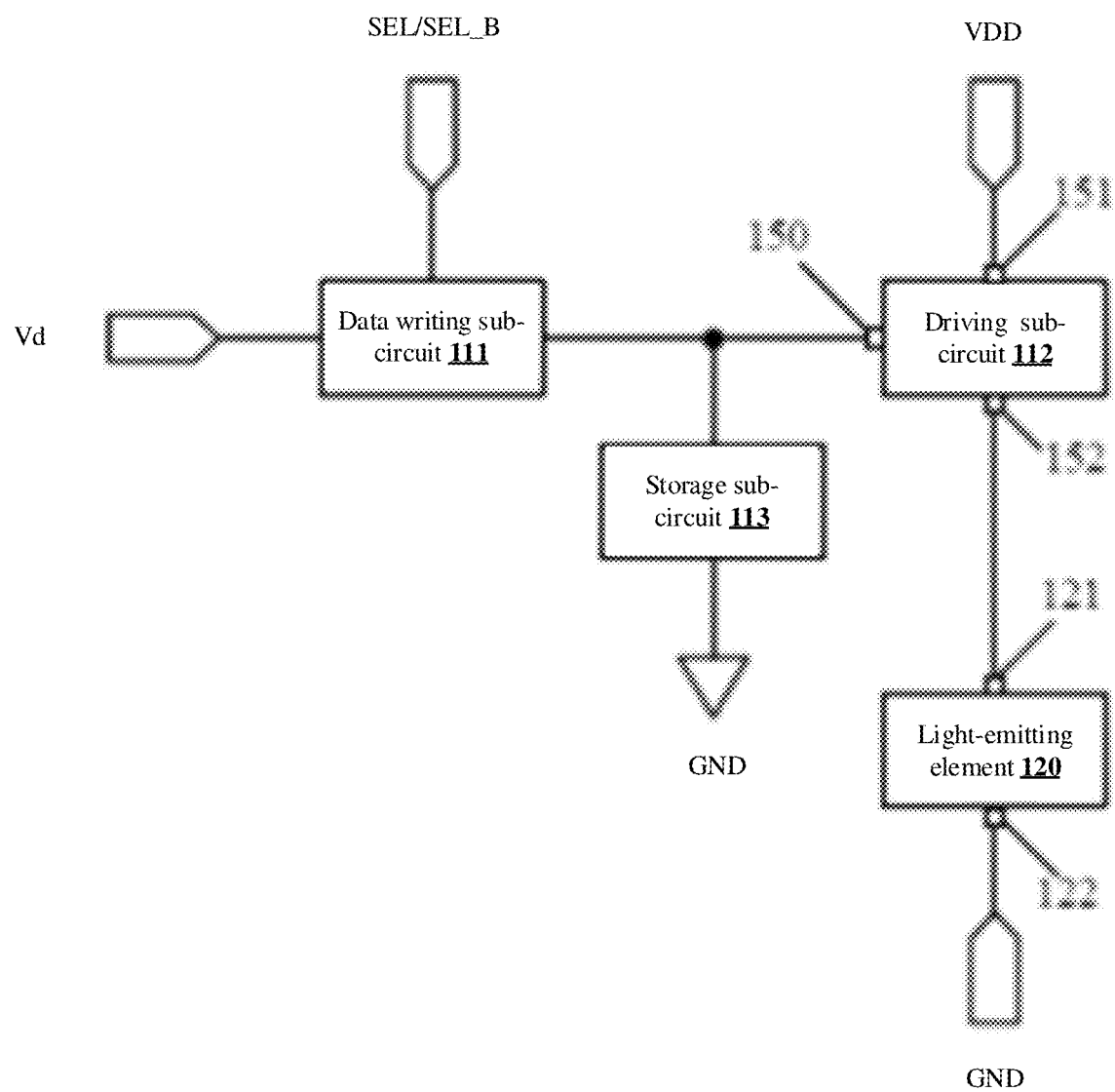
FIG. 2A is a schematic diagram of a pixel circuit provided by some embodiments of the disclosure.

FIG. 2A is a schematic diagram of a pixel circuit provided by some embodiments of the disclosure. As shown in FIG. 2A, the pixel circuit includes a data writing sub-circuit 111, a driving sub-circuit 112, and a storage sub-circuit 113.

An output terminal of the data writing sub-circuit 111 is electrically connected to a first terminal of the storage sub-circuit 113, and the data writing sub-circuit 111 is configured to transmit a data signal Vd to the first terminal of the storage sub-circuit in response to the control signal (including a first control signal SEL and a second control signal SEL_B). A second terminal of the storage sub-circuit 113 is configured to be electrically connected to a ground voltage GND, for example.

The driving sub-circuit 112 includes a control electrode (control terminal) 150, a first electrode (first terminal) 151, and a second electrode (second terminal) 152. The control electrode 150 of the driving sub-circuit is electrically connected to the first terminal of the storage sub-circuit 113. The first electrode 151 of the driving sub-circuit 112 is configured to receive a first power source voltage VDD, and the second electrode 152 of the driving sub-circuit 112 is connected to a first electrode 121 of the light-emitting element 120. The driving sub-circuit 112 is configured to drive the light-emitting element 120 to emit light in response to the voltage at the first terminal of the storage sub-circuit 113. The second electrode 122 of the light-emitting element 120 is, for example, configured to receive a second power source voltage VSS. In some embodiments, the first power supply voltage VDD is, for example, a high voltage, and the second power supply voltage VSS is, for example, a low voltage.

In the embodiments of the present disclosure, at least one of the data writing sub-circuit 111, the driving sub-circuit 112, and the storage sub-circuit 113 is implemented by transistor(s), and the used transistor(s) may be thin film transistor(s) or field effect transistor(s) or other switching device(s) with the same characteristics. In the embodiments of the present disclosure, a metal-oxide semiconductor field effect transistor is taken as an example for description. The source and drain of the transistor used here may be arranged symmetrically in structure, so the source and drain of the transistor may be structurally indistinguishable. In the embodiments of the present disclosure, in order to distinguish the two electrodes of the transistor other than the gate, one electrode is directly described as a first electrode and the other electrode is described as a second electrode. For example, the drain is used as the first electrode and the source is used as the second electrode. In addition, transistors may be divided into N-type and P-type transistors according to their characteristics. When the transistor is a P-type transistor, a turn-on voltage is a low-level voltage (for example, 0V, −5V, −10V or other suitable voltages), and a turn-off voltage is a high-level voltage (for example, 5V, 10V or other suitable voltages)); When the transistor is an N-type transistor, the turn-on voltage is a high-level voltage (for example, 5V, 10V or other suitable voltage), and the turn-off voltage is a low-level voltage (for example, 0V, −5V, 30−10V or other Appropriate voltage).

The display panel provided by the embodiments of the present disclosure may use a rigid substrate, such as a glass substrate, a silicon substrate, etc., or may be formed of a flexible material with excellent heat resistance and durability, such as polyimide (PI) and polycarbonate. (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), cellulose triacetate (TAC), cyclic olefin polymer (COP) and cyclic olefin Copolymer (COC) and so on. The embodiments of the present disclosure are all described by taking a silicon substrate as an example, that is, the pixel structure is prepared on the silicon substrate, however, the embodiments of the present disclosure do not limit this.

In an embodiment, the pixel circuit includes a complementary metal oxide semiconductor circuit (CMOS circuit), that is, the pixel circuit is prepared on a single crystal silicon substrate. Relying on mature CMOS integrated circuit technology, silicon-based process may achieve higher accuracy (for example, PPI may reach 6,500 or even more than 10,000).

In some embodiments of the present disclosure, the data writing sub-circuit 111 may include a transmission gate circuit. The transmission gate circuit includes two transistors which are coupled in parallel and are complementary to each other. The control signal includes two control signals with one control signal being an inversion of the other control signal. The data writing sub-circuit 111 adopts a circuit with a transmission gate structure, which may help to transmit the data signal to the first terminal of the storage sub-circuit 113 without loss. Specifically, the data writing sub-circuit includes a first control electrode, a second control electrode, a first terminal such as a signal input terminal, and a second terminal such as a signal output terminal. The first control electrode and the second control electrode of the data writing sub-circuit are respectively configured to receive the first control signal and the second control signal. The first terminal of the data writing sub-circuit is configured to receive the data signal. The second terminal of the data writing sub-circuit is electrically connected to the first terminal of the storage sub-circuit. The data writing sub-circuit is configured to transmit the data signal to the first terminal of the storage sub-circuit in response to the first control signal and the second control signal.

Figure 2B:
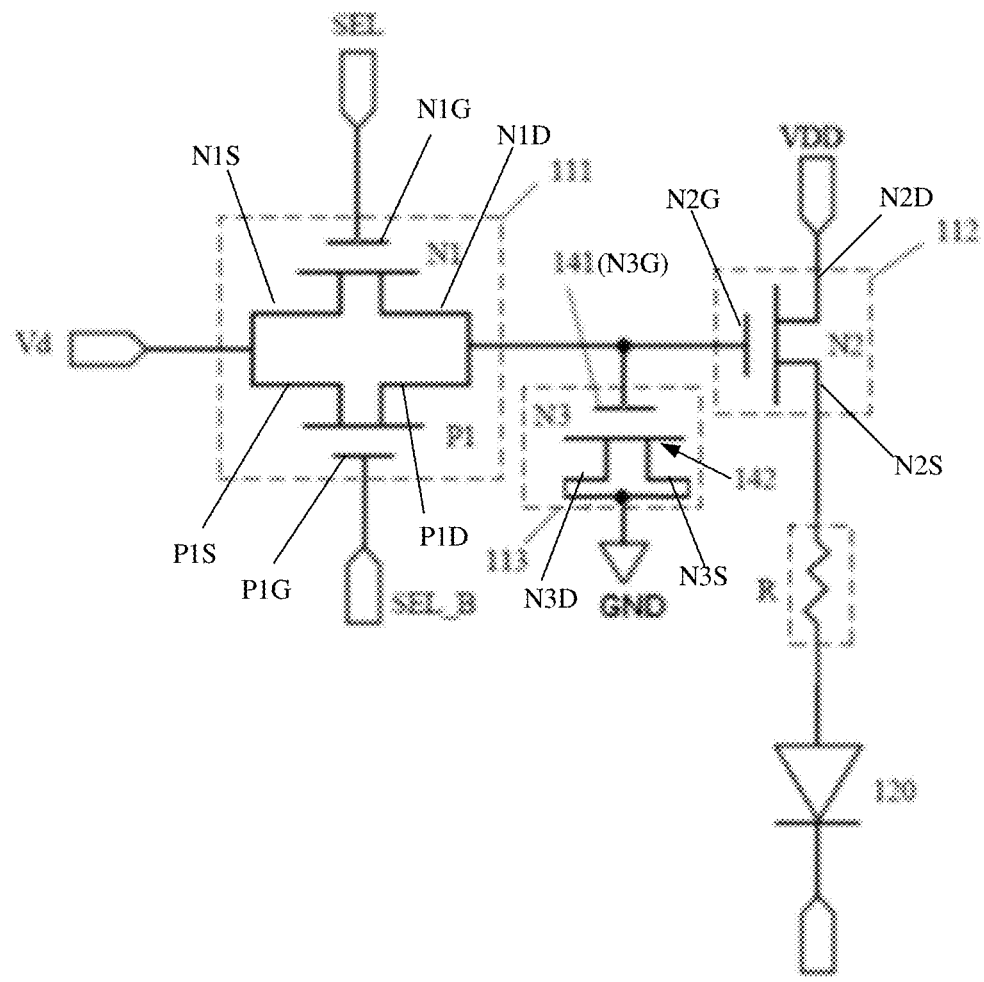
FIG. 2B is a schematic diagram of a pixel circuit provided by some embodiments of the present disclosure.

FIG. 2B is a schematic circuit diagram of a specific implementation example of the pixel circuit shown in FIG. 2A. As shown in FIG. 2B, the data writing sub-circuit 111 includes a transmission gate circuit. The data writing sub-circuit 111 includes a first data writing transistor N1 and a second data writing transistor P1 connected in parallel. The first data writing transistor N1 and the second data writing transistor P1 are respectively an N-type metal-oxide semiconductor field effect transistor (NMOS) and a P-type metal-oxide semiconductor field effect transistor (PMOS). The control signal includes a first control signal SEL and a second control signal SEL_B with one of the first control signal SEL and the second control signal SEL_B is an inversion of the other of the first control signal SEL and the second control signal SEL_B. A gate N1G of the first data writing transistor N1 acts as the first control electrode of the data writing sub-circuit 111, and is configured to receive the first control signal SEL. A gate P1G of the second data writing transistor P1 acts as the second control electrode of the data writing sub-circuit, and is configured to receive the second control signal SEL_B. A second electrode P1S of the second data writing transistor P1 and a second electrode N1S of the second data writing transistor N1 are electrically connected as the first terminal of the data writing sub-circuit, and are configured to receive a data signal Vd. A first electrode P1D of the second data writing transistor P1 and a first electrode N1D of the first data writing transistor N1 are electrically connected as the second terminal of the data writing sub-circuit, and are electrically connected to the control electrode 150 of the driving sub-circuit 112.

In some embodiments, the size of the first data writing transistor N1 is identical to the size of the second data writing transistor P1, and the width to length ratio of the channel of the first data writing transistor N1 is identical to the width to length ratio of the channel of the second data writing transistor P1.

The data writing sub-circuit 111 utilizes the complementary electrical characteristics of the transistors, and has a low on-state resistance regardless of whether it transmits a high level or a low level. Accordingly, the data writing sub-circuit 111 has the advantage of the completeness of electrical signal in transmission, and may transmit the data signal Vd to the first terminal of the storage sub-circuit 113 without loss.

As shown in FIG. 2B, the driving sub-circuit 112 includes a driving transistor N2, for example, the driving transistor N2 is an N-type metal-oxide semiconductor field effect transistor (NMOS). A gate N2G, a first electrode N2D and a second electrode N2S of the driving transistor N2 act as a control electrode, a first electrode and a second electrode of the driving sub-circuit 112, respectively. Specifically, the gate N2G of the driving transistor N2 is electrically connected to the second terminal of the data writing sub-circuit 111 and the first terminal of the storage sub-circuit 113, the first electrode N2D of the driving transistor N2 receives the first power source voltage VDD, and the second electrode N2S of the driving transistor N2 is connected to the first electrode 121 of the light-emitting element 120.

Figure 2C:
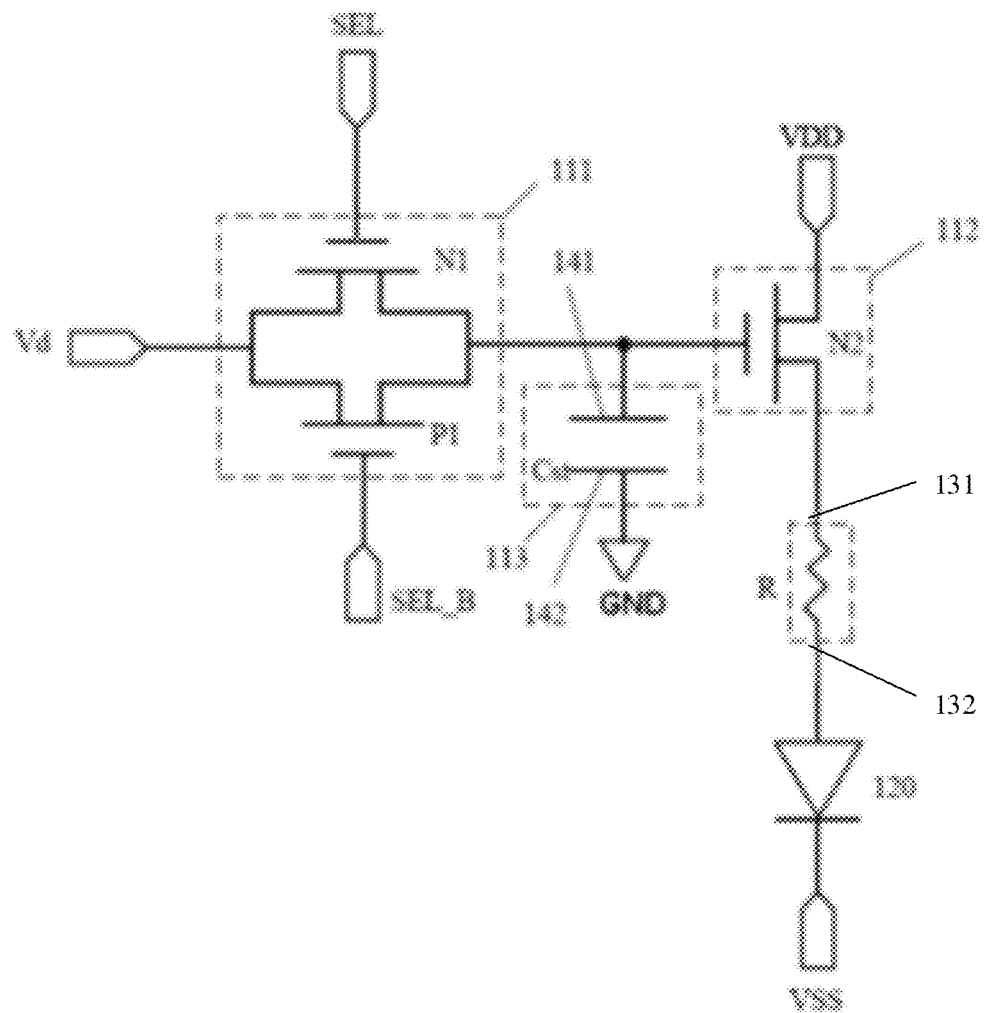
FIG. 2C is an equivalent circuit diagram of FIG. 2B.

As shown in FIG. 2B, the storage sub-circuit includes a storage transistor N3, such as an N-type metal-oxide semiconductor field effect transistor (NMOS). The storage transistor N3 includes a gate N3G, a first electrode N3D, a second electrode N3S, and an active region between the first electrode and the second electrode. The storage transistor N3 acts as a storage capacitor Cst, the gate N3G of the storage transistor N3 acts as a first capacitor electrode 141 of the storage capacitor. A first electrode N3D and a second electrode N3S of the storage transistor are electrically connected. The first electrode, the second electrode and the active region of the storage transistor N3 collectively act as a second capacitor electrode 142 of the storage capacitor. The first electrode, the active region and the second electrode respectively act as a first region, a second region and a third region of the second capacitor electrode 142. The first area and the third area have the same carrier mobility, and the carrier mobility in the second region is different from the carrier mobility in the first region and the carrier mobility in the third region. The first capacitor electrode 141 and the second capacitor electrode 142 act as the first terminal and the second terminal of the storage sub-circuit 113, respectively. For details, please refer to FIG. 2C. FIG. 2C is an equivalent circuit diagram of FIG. 2B, in which the storage transistor N3 is directly shown in the form of a storage capacitor Cst.

The storage transistor N3, the first data writing transistor N1 and the driving transistor N2 are all N-type metal-oxide semiconductor field effect transistors (NMOS), which may be formed by one process, so that the storage capacitor Cst may be formed synchronously while forming the first data writing transistor N1 and the driving transistor N2, avoiding an additional introduction of other electrode layers to form the storage capacitor, thereby reducing process difficulty and saving costs.

As shown in FIGS. 2B and 2C, the pixel circuit further includes a resistor R. A first terminal 131 of the resistor R is electrically connected to the second electrode 152 of the driving sub-circuit 112, and a second terminal 132 is electrically connected to the first electrode 121 of the light-emitting element 120, that is, the second electrode 152 of the driving sub-circuit 112 is electrically connected to the first electrode 121 of the light-emitting element 120 through the resistor R. By providing the electronic device R, it is possible to avoid defects such as dark lines in the display panel caused by short-circuiting between the first electrode 121 and the second electrode 122 of the light-emitting element 120 in the sub-pixel due to process fluctuations.

For example, the resistor R is a constant resistance or a variable resistance, and may also be an equivalent resistance formed by other devices (such as a transistor).

For example, the resistor R and the control electrode 150 of the driving sub-circuit 112, i.e. the gate N2G of the driving transistor N2, are disposed in the same layer and are insulated with each other. A resistivity of the resistor R is higher than a resistivity of the control electrode of the driving sub-circuit. That is, a conductivity of the control electrode of the driving sub-circuit is higher than a conductivity of the resistor. For example, the resistivity of the resistor is ten times or more the resistivity of the control electrode.

It should be noted that the "arranged in the same layer" in the present disclosure refers to a structure in which two (or more than two) structures are formed by one and the same deposition process and are patterned by one and the same patterning process. Their materials may be the same or different. For example, materials for forming precursors of a plurality of structures arranged in the same layer are the same, and the final formed materials may be the same or different. The "integral structure" in the present disclosure refers to two (or more than two) interconnected structures that are formed by one and the same deposition process and patterned by one and the same patterning process, and their materials may be the same or different.

With this arrangement, the driving sub-circuit control electrode and the resistor may be formed in the same patterning process, thereby saving process.

In some embodiments, materials of the resistor and the control electrode of the driving sub-circuit are both polysilicon materials, and a doping concentration of the resistor is lower than a doping concentration of the control electrode. Accordingly, the resistor has a higher resistivity than the resistivity of the control electrode. For example, the resistor may be intrinsic polysilicon or lightly doped polysilicon, and the control electrode may be heavily doped polysilicon.

In some other embodiments, the material of the control electrode may be different from the material of the resistor. For example, the materials of the control electrode and the resistor may respectively include a metal and a metal oxide corresponding to the metal. For example, the metal may include gold (Au), silver (Ag), copper (Cu), aluminum (Al), molybdenum (Mo), magnesium (Mg), tungsten (W), and an alloy material combined with the above metals.

In some embodiments, as shown in FIGS. 2B and 2C, the light-emitting element 120 is specifically implemented as an organic light-emitting diode (OLED). For example, the light-emitting element 120 may be an OLED with a top emission structure, which may emit red light, green light, blue light, or white light, etc. For example, the light-emitting element 120 is a micro OLED (Micro OLED). The embodiments of the present disclosure do not limit the specific structure of the light-emitting element. For example, the first electrode 121 of the light-emitting element 120 is an anode of the OLED, and the second electrode 122 is a cathode of the OLED, that is, the pixel circuit has a common cathode structure. However, the embodiments of the present disclosure do not limit this, and according to changes of the circuit structure, the pixel circuit may also have a common anode structure.

It should be noted that in the description of the embodiments of the present disclosure, the symbol Vd may represent both the data signal terminal and the level of the data signal. Similarly, the symbol SEL may represent both the first control signal and the first control signal terminal. The symbol SEL_B may represent both the second control signal and the second control signal terminal. The symbol GND may represent both the ground voltage and the ground terminal; the symbol VDD may represent both the first power source voltage terminal and the first power source voltage. The symbol VSS may represent both the second power source voltage terminal and the second power source voltage.

Figure 2D:
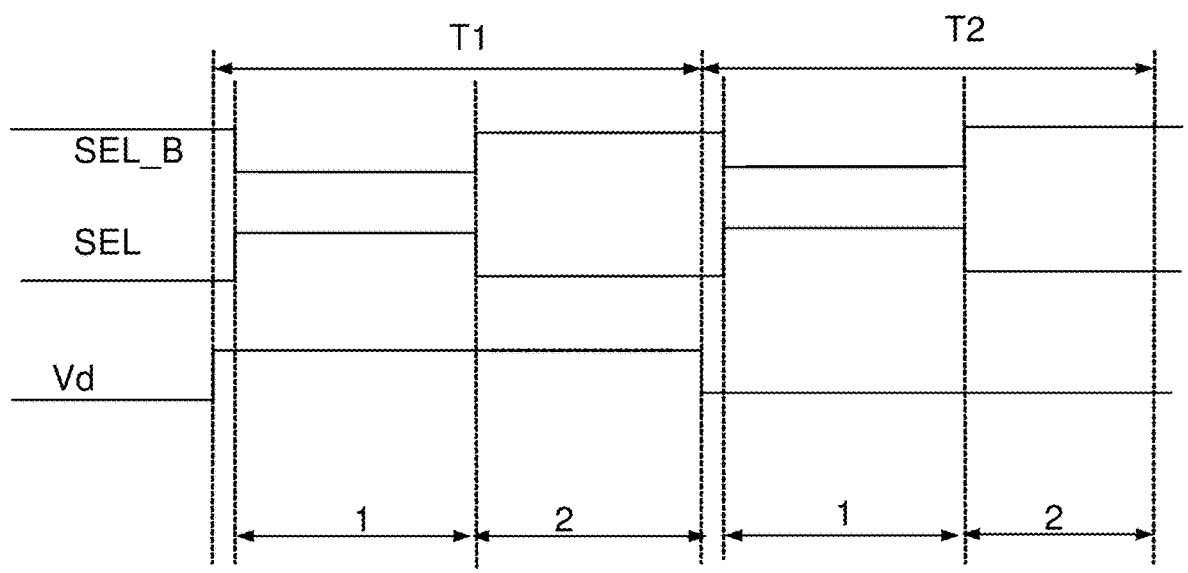
FIG. 2D shows a signal timing diagram of the pixel circuit shown in FIG. 2B.

FIG. 2D shows a signal timing diagram of the pixel circuit shown in FIG. 2B. The principle of operation of the pixel circuit shown in FIG. 2B will be described with reference to the signal timing diagram shown in FIG. 2D. For example, the first data writing transistor and the driving transistor are N-type transistors and the second data writing transistor is a P-type transistor, but embodiments of the disclosure are not limited thereto.

FIG. 2D shows a waveform diagram of each signal in two consecutive display periods T1 and T2. For example, the data signal Vd has a high gray-scale voltage in the display period T1, and a low gray-scale voltage in the display period T2.

For example, as shown in FIG. 2C, the display process of each frame of an image includes a data writing phase 1 and a light emitting phase 2. A working process of the pixel circuit includes: in the data writing phase 1, the first control signal SEL and the second control signal SEL_B are both turn-on signals, the first data writing transistor N1 and the second data writing transistor P1 are conducting, the data signal Vd is transmitted to the gate of the driving transistor N2 through the first data writing transistor N1 and/or the second data writing transistor P1; in the light-emitting phase 2, the first control signal SEL and the second control signal SEL_B are both turned off signals, a voltage across the storage capacitor Cst remains unchanged due to the bootstrap effect of the storage capacitor Cst, the driving transistor N2 works in a saturated state with a current remains unchanged, and drives the light-emitting element 120 to emit light.

In some embodiments, the first control signal SEL and the second control signal SEL_B are differential complementary signals having the same amplitude and opposite phases. This helps to improve an anti-interference performance of the circuit. For example, the first control signal SEL and the second control signal SEL_B may be output by one scan driving circuit unit (such as a GOA unit), thereby simplifying the circuit.

For example, as shown in FIG. 1, the display panel 10 may further include a data driving circuit 14 and a scan driving circuit 13. The data driving circuit 14 is configured to send out a data signal, such as the above-mentioned data signal Vd, as required (for example, an image signal input to the display device). The scan driving circuit 13 is configured to output various scan signals, for example, including the above-mentioned first control signal SEL and second control signal SEL_B. The scan driving circuit is, for example, an integrated circuit chip (IC) or a gate driving circuit (GOA) directly prepared on a display panel.

In some embodiments, the display panel uses a silicon substrate as a base substrate 101. The pixel circuit, the data driving circuit 14 and the scan driving circuit 13 may all be integrated on the silicon substrate. In this case, since the silicon-based circuit may achieve higher accuracy, the data driving circuit 14 and the scan driving circuit 13 may also be formed in the region corresponding to the display region of the display panel, and are not necessarily located in the non-display region.

In some embodiments, the display panel 10 further includes a control circuit. For example, the control circuit is configured to control the data driving circuit 14 to apply the data signal Vd, and to control the scan driving circuit 13 to apply various scan signals. An example of this control circuit is a timing control circuit (T-con). The control circuit may be in various forms, for example, including a processor and a memory. The memory includes an executable code, and the processor runs the executable code to execute the above detection method.

In some embodiments, the processor may be a central processing unit (CPU) or other form of processing device with data processing capability and/or instruction execution capability, for example, it may include a microprocessor, a programmable logic controller (PLC), etc.

In some embodiments, the storage device may include one or more computer program products, and the computer program products may include various forms of computer-readable storage media, such as a volatile memory and/or a non-volatile memory. The volatile memory may include a random access memory (RAM) and/or a cache memory (cache), for example. the non-volatile memory may include, for example, a read-only memory (ROM), a hard disk, a flash memory, and the like. One or more computer program instructions may be stored on a computer-readable storage medium, and the processor may execute functions expected by the program instructions. Various application programs and various data may also be stored in the computer-readable storage medium, such as electrical characteristic parameters obtained in the above detection method.

In the following, the pixel circuit shown in FIG. 2B and FIG. 2C is taken as an example to illustrate the display panel provided by at least one embodiment of the present disclosure, however, the embodiments of the present disclosure are not limited to this.

Figure 3A:
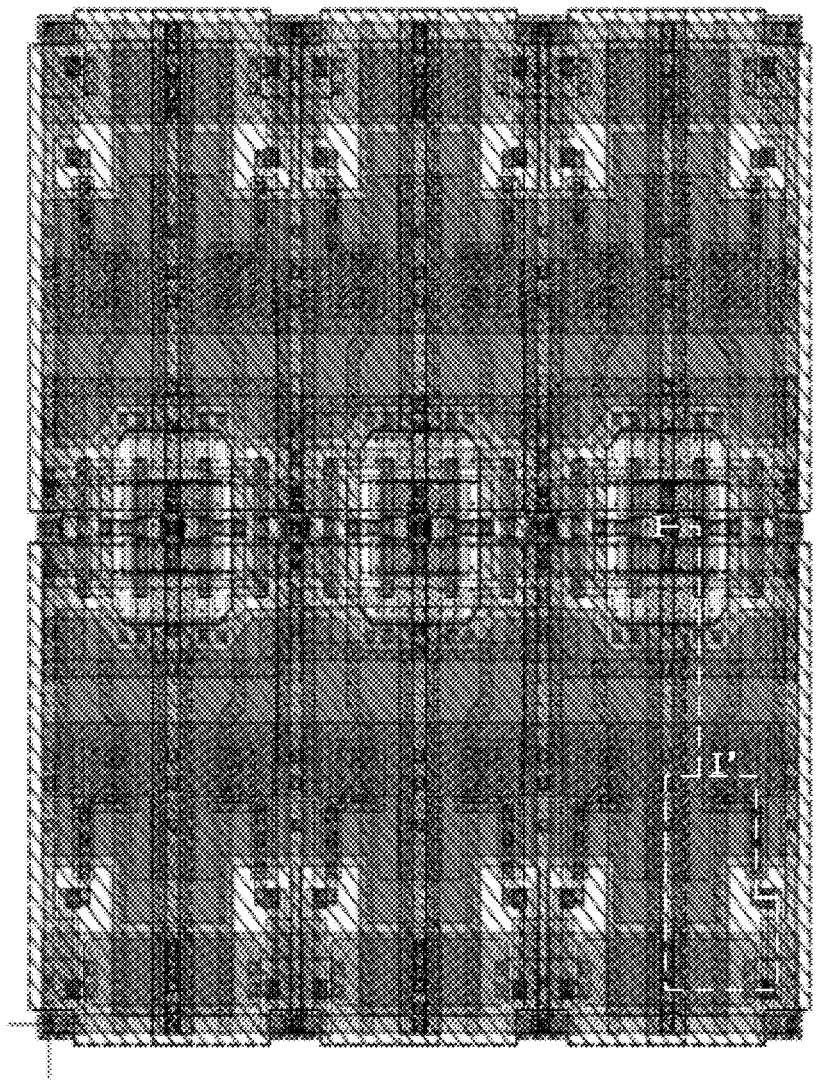
FIG. 3A is a schematic diagram of a display panel provided by some embodiments of the present disclosure.

FIG. 3A is a schematic diagram of a display panel provided by some embodiments of the present disclosure. For example, as shown in FIG. 3A, the display panel 10 includes a base substrate 101 on which a plurality of sub-pixels 100 are located. The plurality of sub-pixels 100 are arranged as a sub-pixel array. A column direction of the sub-pixel array is a first direction D1, a row direction of the sub-pixel array is a second direction D2. The first direction D1 and the second direction D2 cross each other, for example, being perpendicular to each other. FIG. 3A exemplarily shows two rows and six columns of sub-pixels, that is, two pixel rows and six pixel columns, and a region of each of three pixel columns spaced apart from each other is shown with a dashed frame.

For example, the base substrate 101 may be a rigid substrate, such as a glass substrate, a silicon substrate, etc., or it may be formed of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), cellulose triacetate (TAC), cyclic olefin polymer (COP) and cyclic olefin copolymer (COC) and so on. The embodiments of the present disclosure are all described by taking the base substrate 101 as a silicon substrate as an example, but the embodiments of the present disclosure are not limited to this.

For example, the base substrate 101 includes single crystal silicon or high-purity silicon. The pixel circuit is formed on the base substrate 101 through CMOS semiconductor process. For example, an active region (including a channel region of the transistor), a first electrode and a second electrode of the transistor are formed in the base substrate 101 through doping process, and each insulating layer is formed through silicon oxidation process or chemical vapor deposition process (CVD), and a plurality of conductive layers are formed through sputtering process to form a wiring structure. The active region of each transistor is located inside the base substrate 101.

Figure 3B:
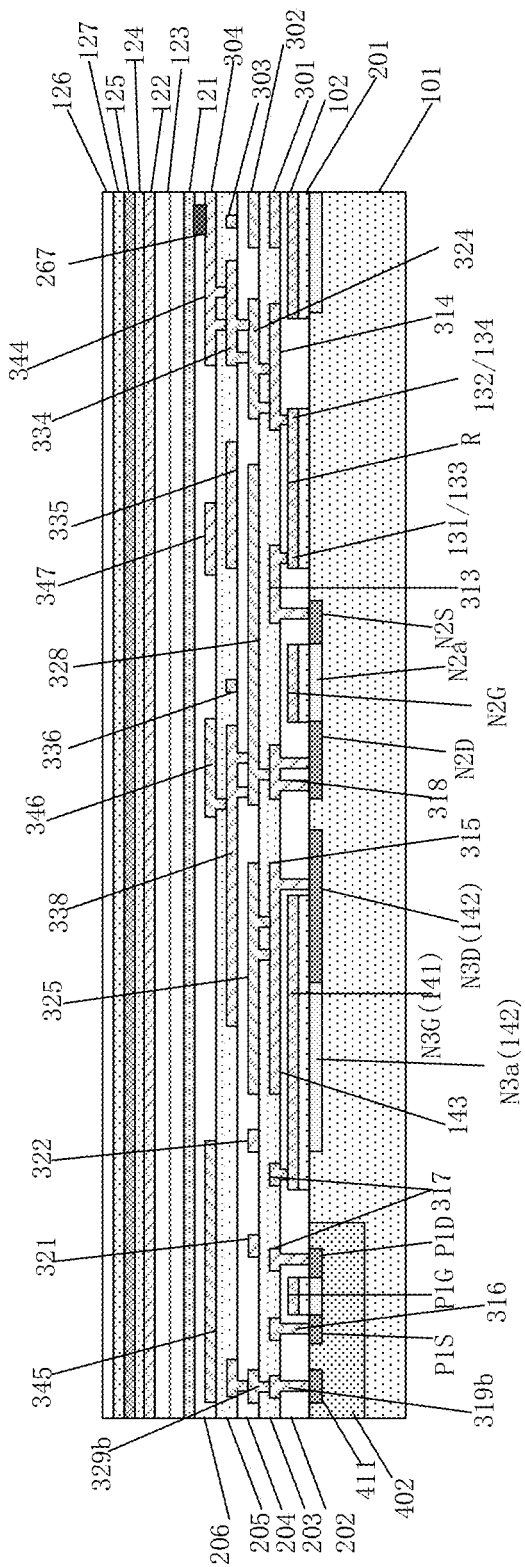
FIG. 3B is a cross-sectional view of FIG. 3A along a section line I-I'.

FIG. 3B shows a cross-sectional view of FIG. 3A along a section line I-I'. For clarity, some wiring or electrode structures that are not directly connected are omitted in FIG. 3B.

For example, as shown in FIG. 3B, the display panel 10 includes a base substrate 101, a first insulating layer 201, a polysilicon layer 102, a second insulating layer 202, a first conductive layer 301, a third insulating layer 203, a second conductive layer 302, a fourth insulating layer 204, a third conductive layer 303, a fifth insulating layer 205, and a fourth conductive layer 304 sequentially located on the base substrate 101. Hereinafter, the structure of the display panel 10 will be described hierarchically, and FIG. 3B will be used as a reference and will be described together.

Figure 4A:
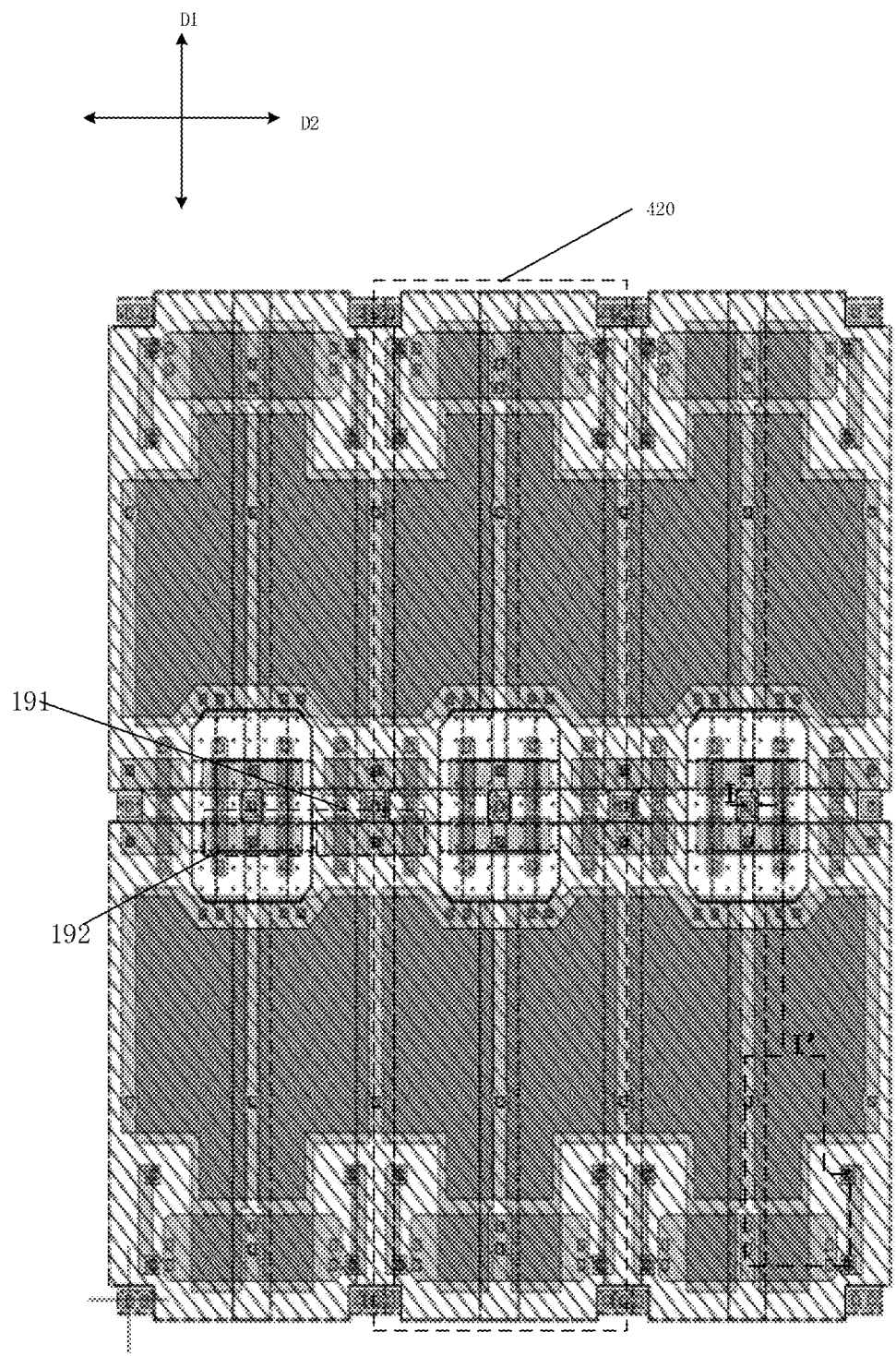
FIG. 4A is a schematic diagram of a display panel provided by some embodiments of the present disclosure.
Figure 4B:
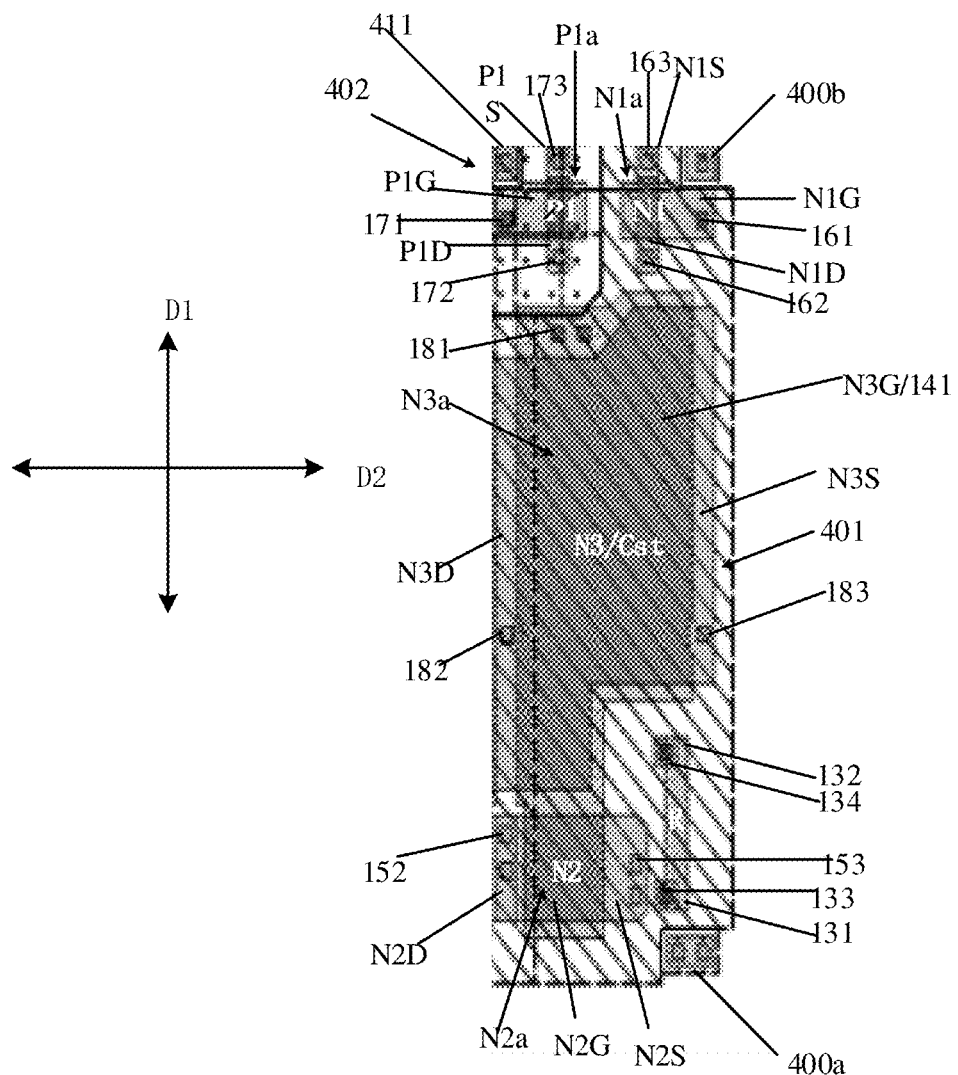
FIG. 4B is a schematic diagram of a sub-pixel in FIG. 4A.

For clarity and ease of description, FIG. 4A shows a part of the display panel 10 below the first conductive layer 301, that is, the base substrate 101, the first insulating layer 201 and the polysilicon layer 102 that are located on the base substrate, this part includes the transistors (P1, N1, N2), the storage capacitor Cst (i.e, the storage transistor N3), and the resistor R. FIG. 4B shows a sub-pixel 100 in FIG. 4A, for example, an enlarged schematic diagram of the sub-pixel at the bottom right in FIG. 4A. For clarity, FIG. 4A also correspondingly shows the section line I-I' in FIG. 3A.

As shown in FIG. 4B, for example, in a direction parallel to a surface of the base substrate 101, the transmission gate circuit including the first data writing transistor N1 and the second data writing transistor P1 and the driving transistor N2 are located on both sides of the storage capacitor Cst, for example, are located on two opposite sides of the storage capacitor Cst in the first direction D1.

In some embodiments, the storage transistor N3 acts as a storage capacitor Cst, and the storage transistor N3 includes a gate N3G, a first electrode N3D, a second electrode N3S, and an active region N3a located between the first electrode and the second electrode. The gate N3G of the storage transistor N3 acts as a first capacitor electrode 141 of the storage capacitor Cst, the first electrode N3D and the second electrode N3S of the storage transistor N3 are electrically connected, and the first electrode, the second electrode and the active region N3a collectively act as a second capacitor electrode 142 of the storage capacitor. Specifically, the first electrode N3D, the active region N3a, and the second electrode N3S of the storage transistor N3 respectively act as a first region, a second region and a third region of the second capacitor electrode 142, the first area and the third area have the same carrier mobility, and a carrier mobility in the second area is different from the carrier mobility in the first region and the carrier mobility in the third region. As shown in 4B, the first region, the second region, and the third region of the second capacitor electrode 142 are sequentially arranged along a short side direction of the sub-pixel, that is, a second direction D2. The carrier mobility in the first region and the carrier mobility the third region are the same, the carrier mobility in the second region is different from the carrier mobility in the first region and the carrier mobility in the third region, and an area of the second region is larger than an area of the first region and an area of the third region.

A material of the active region N3a of the memory transistor N3 is a semiconductor material. In some embodiments, the base substrate 101 is a P-type silicon-based substrate, a material of the base substrate 101 is, for example, P-type single crystal silicon, and the active region N3a of the storage transistor N3 is formed by performing N-type light doping on a P-type silicon-based substrate. The N-type doping process may be, for example, an ion implantation process, and a doping element may be, for example, boron. When a voltage is applied to the first capacitor electrode 141, the active region N3a of the storage transistor N3 becomes a conductor, so that the first electrode N3D, the second electrode N3S, and the active region N3a of the storage transistor N3 form a conductor structure as the second capacitor electrode 142 of the storage capacitor Cst.

In some embodiments, as shown in FIG. 4B, in the first direction D1 parallel to the base substrate, the resistor R and the driving transistor N2 are located on one side of the storage capacitor Cst. As shown in FIGS. 2B and 2C, the second electrode N2S of the driving transistor N2 is connected to the first electrode 121, for example, an anode of the light emitting device 120 through a resistor R. Therefore, the resistor R and the driving transistor N2 are located on one side of the storage capacitor Cst, such that a distance between the resistor R and the driving transistor N2, especially a distance between a first terminal 131 of the resistor R and the second electrode N2S of the driving transistor N2 may be reduced as much as possible, thereby reducing a size of a wiring connecting the first terminal of the resistor R with the second electrode N2S of the driving transistor N2.

In some embodiments, as shown in FIG. 4B, in the second direction D2, the driving transistor N2 and the resistor R are arranged in sequence, and the resistor R is located on a side of the second electrode N2S of the driving transistor N2 away from the first electrode N2D of the driving transistor N2. The resistor R is substantially elongated extending in the first direction D1, and the resistor R further includes protrusions that are facing the driving transistor N2 in the second direction at the first terminal 131 and the second terminal 132 of the resistor R, so as to provide contact hole regions described later. Specifically, the first terminal 131 of the resistor R is provided with a contact hole region 133 for electrical connection with the second electrode N2S of the driving transistor N2. The second terminal 132 of the resistor R is provided with a contact hole area 134 for electrical connection with the first electrode 121 of the light-emitting element 120. As shown in FIG. 4B, the first terminal 131 of the resistor R is closer to the driving transistor N2 than the second terminal 132 of the resistor R is.

In some embodiments, as shown in FIG. 4B, the transmission gate circuit includes a first data writing transistor N1 and a second data writing transistor P1. The second data writing transistor P1 and the first data writing transistor N1 are arranged side by side in the second direction D2, and are arranged symmetrically with respect to a symmetry axis along the first direction D1. Specifically, the gate N1G of the first data writing transistor N1 and the gate P1G of the second data writing transistor P1 are arranged side by side in the second direction D2 and are arranged symmetrically with respect to the symmetry axis along the first direction D1. The first electrode N1D of the input transistor N1 and the first electrode P1D of the second data writing transistor P1 are arranged side by side in the second direction D2 and are arranged symmetrically with respect to the symmetry axis along the first direction D1. The second electrode N1S of the first data writing transistor N1 and the second electrode P1S of the second data writing transistor P1 are arranged side by side in the second direction D2 and are arranged symmetrically with respect to the symmetry axis along the first direction D1. The active region N1a of the first data writing transistor N1 and the active region P1a of the second data writing transistors P1 are arranged side by side in the second direction D2, and are arranged symmetrically with respect to the symmetry axis along the first direction D1.

In some embodiments, the first capacitor electrode 141 of the storage capacitor Cst, i.e. the gate N3G of the storage transistor N3, and the resistor R are disposed in the same layer and are insulated with each other. Both the first capacitor electrode 141 of the storage capacitor Cst, i.e. the gate N3G of the storage transistor N3, and the resistor R include a polysilicon material. The polysilicon material is doped to form the first capacitor electrode 141 of the storage capacitor Cst and the resistor R. A doping concentration of the first capacitor electrode 141 of the storage capacitor Cst is higher than a doping concentration of the resistor R, so that a conductivity of the resistor R is lower than the first capacitor electrode 141 of the storage capacitor Cst, that is, a resistivity of the resistor R is higher than the first capacitor electrode 141 of the storage capacitor Cst.

In some embodiments, as shown in FIG. 4B, a shortest distance between the channel of the driving transistor N2 and the first data writing transistor N1 is greater than a shortest distance between the channel of the driving transistor N2 and the second data writing transistors P1. That is, a shortest distance from an overlapping portion of the gate and the active layer of the driving transistor N2 to the first data writing transistor N1 is greater than a shortest distance from the overlapping portion of the gate and the active layer of the driving transistor N2 to the second data writing transistor P1.

In some embodiments, as shown in FIG. 4B, a shortest distance between the resistor R and the first data writing transistor N1 is smaller than a shortest distance between the resistor R and the second data writing transistor P1.

Herein, a shortest distance between two components refers to a smallest distance between any point on one component and any point on the other component.

In some embodiments, as shown in FIG. 4B, a width of the resistor R is smaller than a width of one of the gate N1G of the first data writing transistor N1, the gate P1G of the second data writing transistor P1, and the gate N2G of the driving transistor N2. The gate N1G of the first data writing transistor N1, the gate P1G of the second data writing transistor P1, and the gate N2G of the driving transistor N2 extend along the second direction D2, and the resistor R extends in the first direction D1.

In some embodiments, the gates P1G, N1G, N2G, and N3G of the transistors P1, N1-N3 are all arranged in the same layer, include a polysilicon material, and are formed by the same doping process. In some embodiments, as shown in FIG. 4B, the gate N3G of the driving transistor N2 and the first capacitor electrode 141, that is, the gate N3G of the storage transistor N3, are connected to each other as an integral structure.

In some embodiments, as shown in FIG. 4B, the sub-pixel includes a first region 401 and a second region 402, wherein the second region 402 is an N-type well region formed by N-type heavy doping in the P-type base substrate 101. The first region 401 is a remaining region in the sub-pixel 100 where the N-type well region is removed. The second data writing transistor P2 is formed in the second region 402. The first data writing transistor N1, the driving transistor N2, the storage transistor N3, and the resistor R are all formed in the first region 401.

In some embodiments, FIG. 4B also shows the active regions P1a, N1a, N2a, and N3a of each transistor P1, N1-N3. The active regions N1a, N2a, and N3a of the first data writing transistor N1, the driving transistor N2, and the storage transistor N3 are all formed on the P-type substrate 101 using an N-type light doping process, and they may be formed synchronously using one doping process. The active region P1a of the second data writing transistor P1 is formed in the second region 402 by a P-type lightly doped process.

As shown in FIG. 4B, an area of the active region N2a of the driving transistor N2 is larger than an area of the active region N1a of the first data writing transistor N1 and an area of the active region P1a of the second data writing transistor P1. A larger aspect ratio may be achieved to helps improve driving capability of the driving transistor N2, thereby improving the display effect.

As shown in FIG. 4B, an area of the active region N3a of the storage transistor N3 is significantly larger than an area of an active area of each of other transistors. Therefore, when the storage transistor N3 is used as the storage capacitor Cst, a capacitance value of the storage capacitor of the sub-pixel may be guaranteed, and the display effect may be ensured.

In some embodiments, the first electrodes P1D, N1D, N2D, N3D and the second electrodes P1S, N1S, N2S, and N3S of each transistor P1, N1-N3 are all implemented by heavily doping a part of the corresponding active region, for example, by using a corresponding gate formed subsequently as a mask to implement the doping process. Specifically, the first electrodes N1D, N2D, N3D of the first data writing transistor N1, the driving transistor N2, and the storage transistor N3, the second electrodes N1S, N2S, and N3S of the first data writing transistor N1, the driving transistor N2, and the storage transistor N3 are all formed through N-type heavy doping in the first region 401. They may be formed synchronously by the same doping process. The first electrode P1D and the second electrode P1S of the second data writing transistor P1 are formed in the second region 402 through P-type heavy doping.

FIG. 4B also shows a gate contact region 161, a first electrode contact region 162 and a second electrode contact region 163 of the first data writing transistor N1, a gate contact region 171, a first electrode contact region 172 and a second electrode contact region 173 of the second data writing transistor P1, a first electrode contact region 152 and a second electrode contact region 153 of the driving transistor N2, a gate contact region 181, a first electrode contact region 182 and a second electrode contact region 183 of the storage transistor N3. Each first electrode contact region is a region of a corresponding first electrode to form an electrical contact, each second electrode contact region is a region of a corresponding second electrode to form an electrical contact, and each gate contact region is a region of a corresponding gate electrode to form an electronic contact.

As shown in FIG. 4B, for a transistor with a large active area, such as the driving transistor N2, since there is enough space, at least two contact regions may be provided on the first electrode and the second electrode, respectively, so that it may be connected to the structure to be connected and form a parallel structure, thereby reducing a contact resistance.

In some embodiments, FIG. 4B also shows contact hole regions 411, 400a, 400b. The contact hole region 411 is located in the second region 402, and is configured to be electrically connected to the first power source voltage VDD to perform high voltage bias on the N-type substrate where the second data writing transistor P1 is located. The contact hole regions 400a, 400b are located in the first region 401, and are respectively located on both sides of the storage capacitor Cst in the first direction D1. The contact hole regions 400a, 400b are both configured to be electrically connected to the ground voltage GND to perform low voltage bias on the P-type substrate where the transistors N1-N3 are located. The contact hole regions 400a and 400b are formed through P-type heavy doping, which may be formed synchronously with the first electrode P1D and the second electrode P1S of the second data writing transistor P1. The contact hole region 411 is formed through N-type heavy doping, and may be formed synchronously with the first electrode N1D and the second electrode N1S of the first data writing transistor N1.

In conjunction with reference to FIG. 4A, two sub-pixels 100 adjacent in the first direction D1 are arranged symmetrically with respect to a symmetry axis along the second direction D2, and two sub-pixels 100 adjacent in the second direction D2 are arranged symmetrically with respect to a symmetry axis along the first direction D1. Specifically, the distribution of the transistor(s) (e.g., including the shape, size, etc. of the transistor), the storage capacitor, and the resistor in the two sub-pixels adjacent in the first direction D1 are symmetric with respect to a symmetry axis in the second direction D2. That is, corresponding structures in the two sub-pixels are symmetric with respect to the symmetry axis along the second direction D2. The distribution of the transistor(s), the storage capacitor, and the resistor in the two sub-pixels 100 adjacent in the second direction D2 are symmetric with respect to the symmetry axis along the first direction D1.

This symmetric setting may improve the homology of the process error, thereby increasing the uniformity of the display panel. Further, such a symmetrical setting makes some structures that may be formed in the same layer in the substrate and connected to each other may be implemented integrally. As compared to separate settings, the pixel layout can be made more compact, improving space utilization, thereby improving the resolution of the display panel.

In some embodiments, as shown in FIG. 4, the second regions 402 of two sub-pixels 100 adjacent in the first direction D1 are formed into an integral structure, and the second regions 402 of two sub-pixels adjacent in the second direction D2 are formed into an integral structure. That is, the second regions of the four adjacent sub-pixels 100 form an N-type well region 402N. The second data writing transistors P1 of the four adjacent sub-pixels 100 are located in the same N-type region 402N. The four adjacent sub-pixels constitute a pixel group 420. As compared to an independent N-type region being provided for each sub-pixel, this arrangement may make the arrangement of the pixels more compact under the premise of satisfying the design rules, which is beneficial to improve the resolution of the display panel.

In some embodiments, as shown in FIG. 4A, the four adjacent sub-pixels 100 share the same contact hole region 411, and the contact hole region 411 is located at a center position of the N-type well region 402N.

In some embodiments, as shown in FIG. 4A, the active regions P1a of the second data writing transistors P1 of two adjacent sub-pixels in the first direction D1 are connected to each other to form an integral structure. The second data writing transistors P1 of the two adjacent sub-pixels share the second electrode P1S.

In some embodiments, as shown in FIG. 4A, the active regions N1a of the first data writing transistors N1 of two adjacent sub-pixels in the first direction D1 are connected to each other as an integral structure. The first data writing transistors N1 of the two adjacent sub-pixels share the second electrode N1S.

In some embodiments, as shown in FIG. 4A, the gates N1G of the first data writing transistors N1 of the two adjacent sub-pixels 100, or the gates P1G of the second data writing transistors P1 of the two adjacent sub-pixels 100 in the second direction D2 are connected to each other to form an integral structure.

For each row of pixels, the gate of each one of the first data writing transistors N1 is configured to receive the same first control signal SEL, and the gate of each one of the second data writing transistor P1 is configured to receive the same second control signal SEL_B. In addition, the transistors of the two adjacent sub-pixels in the second direction D2 are arranged mirror-symmetrically, the first data writing transistors N1 of the two sub-pixels adjacent to each other and the second data writing transistor P1 of the two sub-pixels adjacent to each other appear alternately in the second direction D2. Therefore, the gates of the two adjacent first data writing transistors N1 may be directly connected as an integral structure, forming a first control electrode group 191. The gates of the adjacent second data writing transistors P1 may be directly connected as an integral structure, forming a second control electrode group 192. This arrangement may make the arrangement of the pixels more compact on the premise of meeting design principles, which helps to improve a resolution of the display panel.

As shown in FIG. 4A, for two sub-pixels 100 adjacent in the second direction D2, when the driving transistors N2 of the sub-pixels are adjacent, the active regions N2a of the two driving transistors N2 are connected to each other to form an integral structure, and the two driving transistors N2 share the first electrode N2D. This arrangement may make the arrangement of the pixels more compact on the premise of meeting design principles, which helps to improve the resolution of the display panel.

As shown in FIG. 4A, for two sub-pixels 100 adjacent in the second direction D2, when the driving transistors N2 of the sub-pixels are adjacent, the storage transistors N3 of the two adjacent sub-pixels share the first electrode N3D; When the resistors R of the sub-pixels are adjacent, the storage transistors N3 of two adjacent sub-pixels share the second electrode N3S. This arrangement may make the arrangement of the pixels more compact on the premise of meeting the design rules, which helps to improve the resolution of the display panel.

FIG. 5A-5H show a forming process of the substrate structure shown in FIG. 4A. As shown in FIG. 4A, the display panel includes a plurality of pixel unit groups 420 arranged along the first direction D1 and the second direction D2.

The forming process of the display panel provided by the embodiments of the present disclosure will be exemplarily described below in conjunction with FIGS. 5A-5H, however, this should not be construed as limiting the present disclosure.

For example, a silicon-based base substrate 101 is provided, for example, a material of the silicon-based base substrate is P-type single crystal silicon. An N-type transistor (such as a drive transistor) may be directly fabricated on the P-type silicon substrate, that is, directly doped on the P-type substrate to form a channel region of the N-type transistor, which is beneficial to take advantage of the high-speed of the NMOS device, and thereby improving the circuit performance.

Figure 5A:
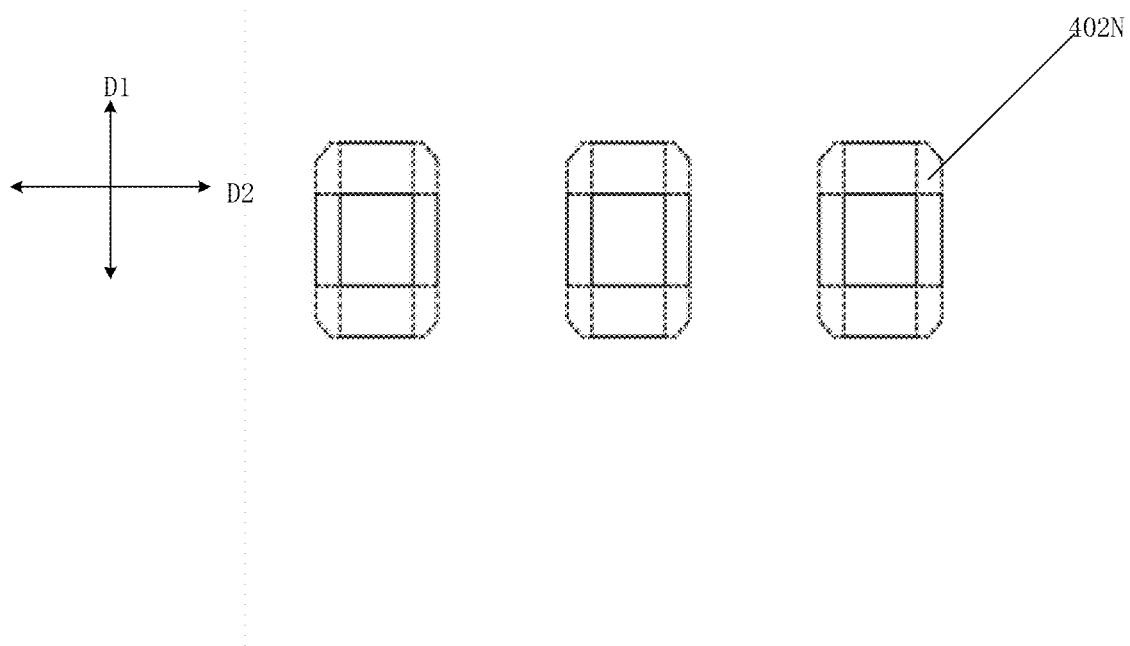
FIG. 5A-5H are diagrams showing manufacturing steps of the display panel shown in FIG. 4A.

FIG. 5A shows the N-type well region formed on the base substrate. As shown in FIG. 5A, in some embodiments, N-type heavy doping is performed on the P-type silicon substrate to form an N-type well region 402N, including the second region 402 of the sub-pixel, which is used as a substrate of the second data writing transistor P1.

In some embodiments, the second regions 402 of the two sub-pixels adjacent in the first direction D1 may be connected to each other, and the second regions 402 of the two sub-pixels adjacent in the second direction D2 may be connected to each other. For example, the second regions 402 of four sub-pixels in a pixel group 420 are connected to form an integral structure, which is formed as an N-type well region 402N of the pixel group 420. FIG. 5A shows the N-type well regions of three adjacent pixel groups. In some embodiments, a region on the base substrate 101 that is undoped is shielded when an N-type intermediate doping is performed to form the N-type well region.

Figure 5B:
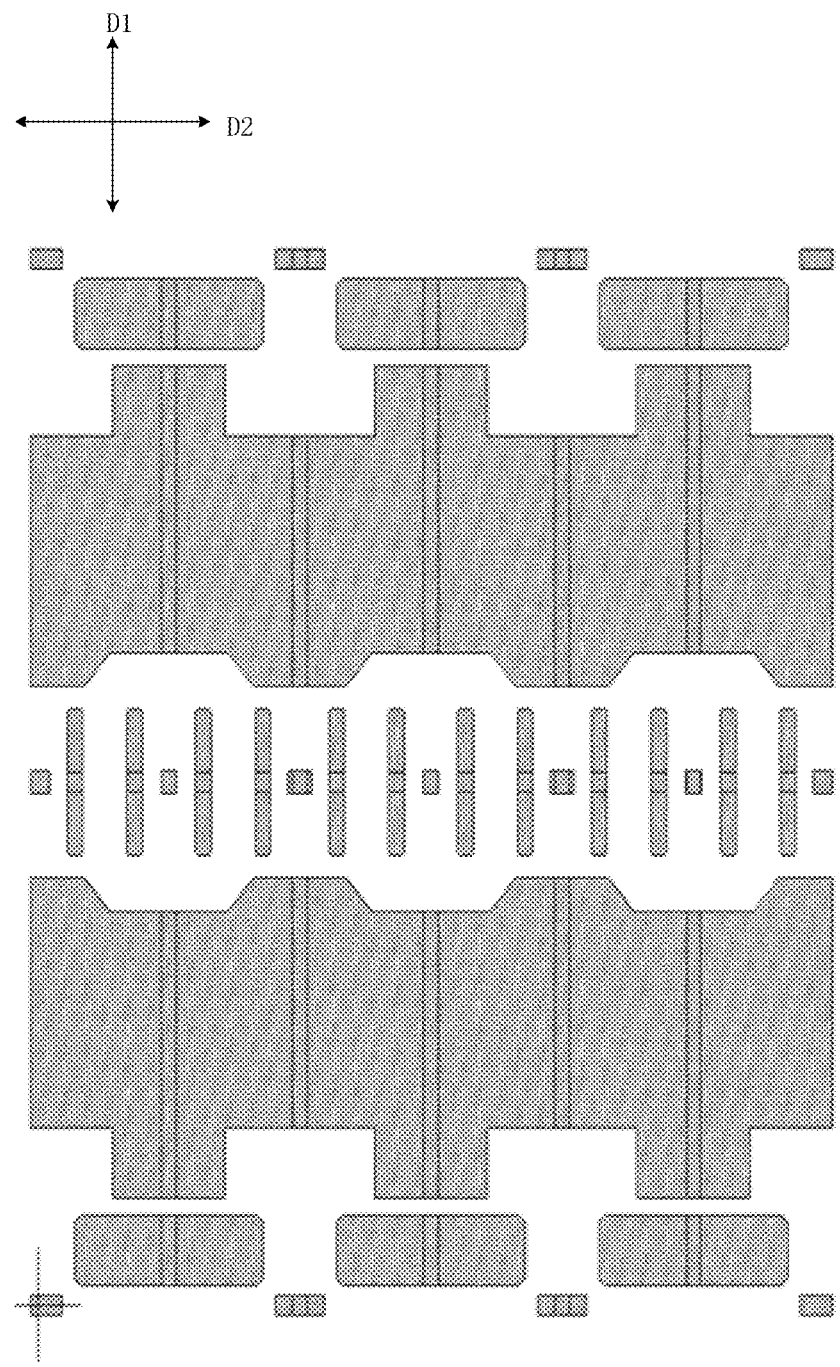
Figure 5C:
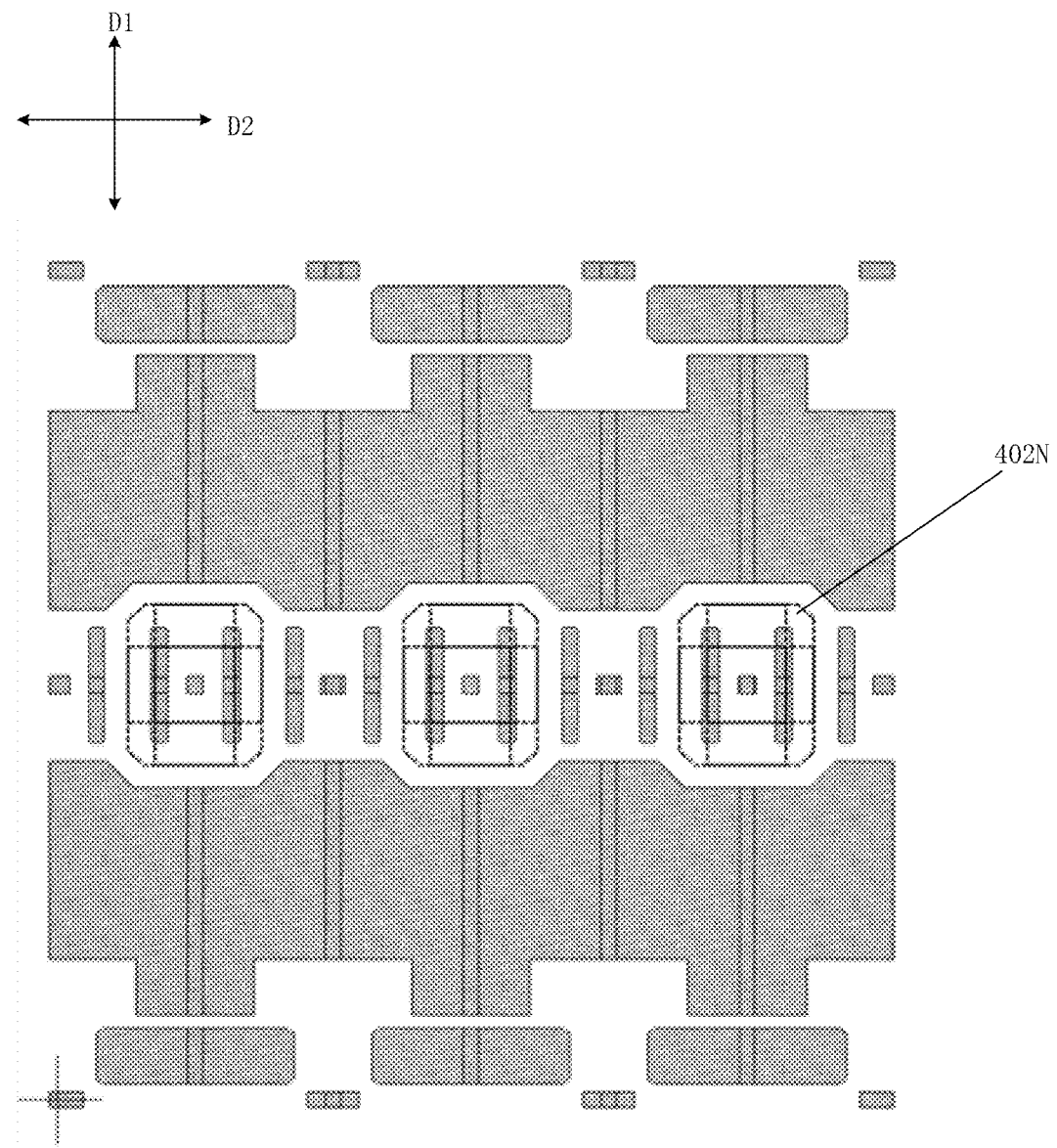

FIG. 5B shows an active region pattern on the base substrate, and the lower diagram in FIG. 5C shows the active region pattern formed on the substrate structure shown in FIG. 5A. The active region pattern may be obtained by performing light doping on the base substrate. Specifically, in the N-type well region, an active region pattern of the second data writing transistor P1 is formed in the N-type well region by P-type light doping, the active region pattern is configured to be subsequently used to form the first electrode P1D, the second electrode P1S and the active region P1a used as the channel of the second data writing transistor P1. Outside the N-type crystal well region, active region patterns of the first data writing transistor N1, the driving transistor N2 and the storage transistor N3 are formed by N-type light doping, The active region patterns of the first data writing transistor N1, the driving transistor N2 and the storage transistor N3 are respectively configured to be subsequently used to form the first electrodes N1D, N2D, N3D, the second electrodes N1S, N2S, and the active regions N1a, N2a, N3a used as the channels of the first data writing transistor N1, the driving transistor N2, and the storage transistor N3.

During the doping process, N-type doping and P-type doping need to be performed separately. When the N-type doping process is performed, a barrier layer needs to be formed to shield a region where the N-type doping is not performed; when the P-type doping process is performed, a barrier layer needs to be formed to shield a region where the P-type doping is not performed.

Figure 5D:
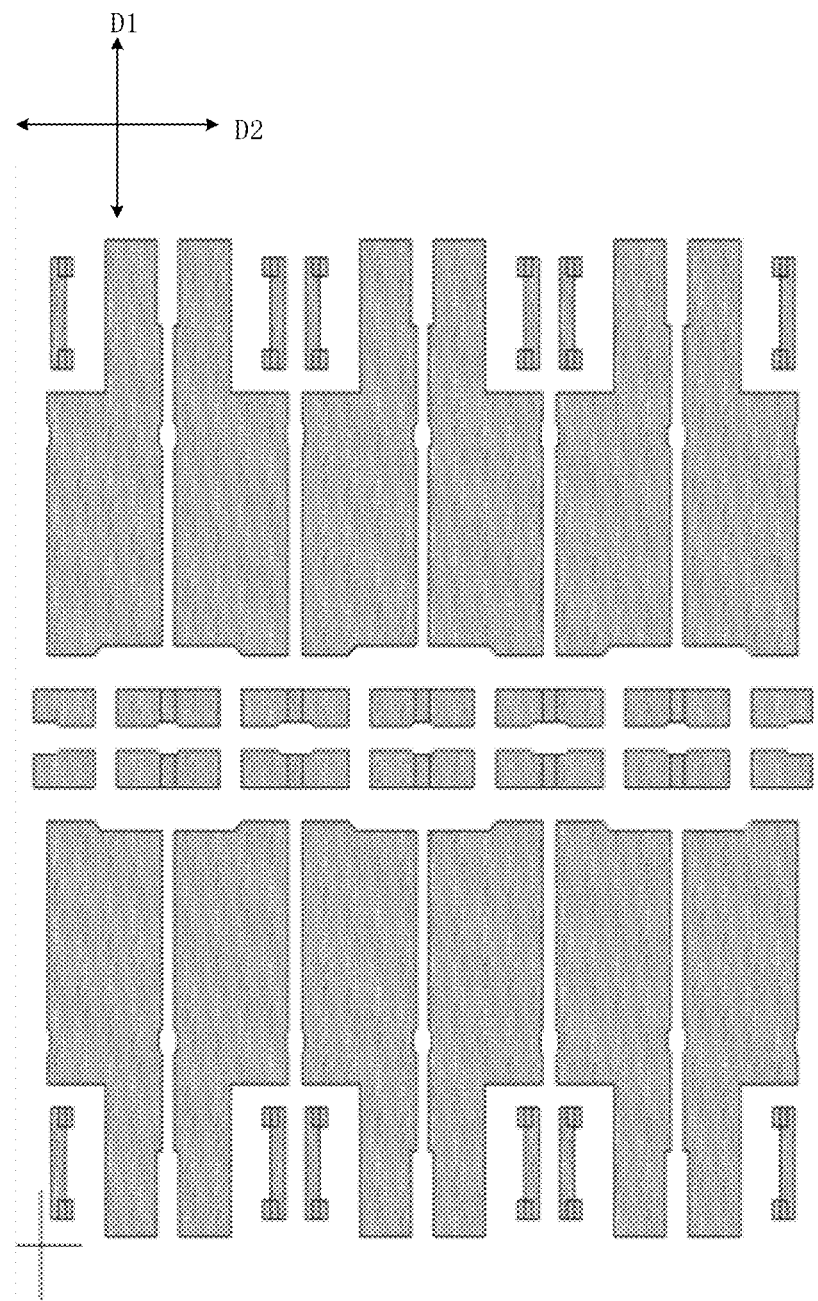
Figure 5E:
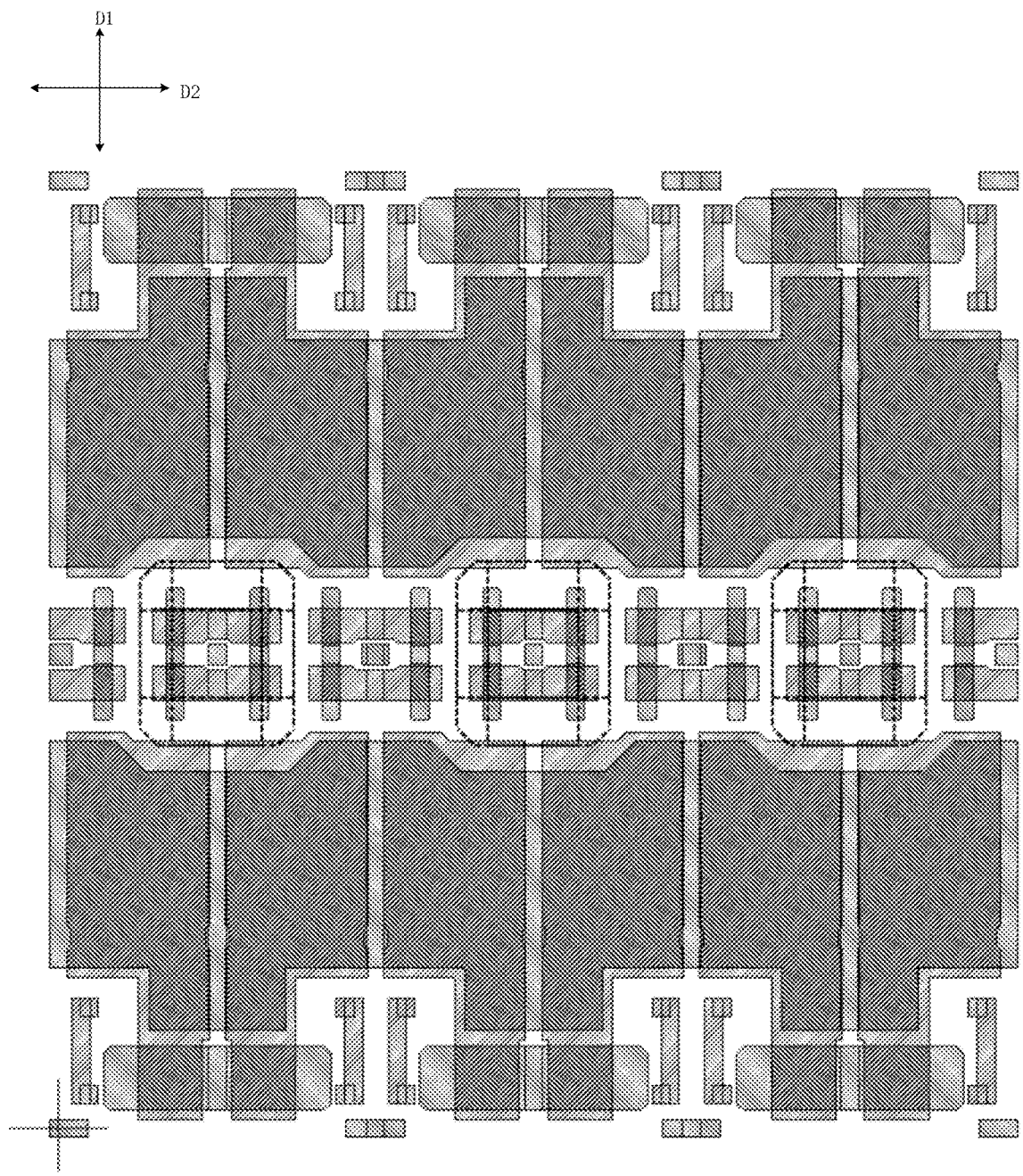

FIG. 5D shows a polysilicon layer pattern on the base substrate, and the lower diagram in FIG. 5E shows the polysilicon layer pattern formed on the substrate structure shown in FIG. 5C.

Referring to FIGS. 3B, 4B, and 5E in conjunction, in some embodiments, a first insulating layer 201 is formed on the base substrate 101, and then a polysilicon layer 102 is formed on the first insulating layer 201. Those skilled in the art should understand that, in order to clearly show a relationship between the various film layers, the transparent first insulating layer 201 is omitted in FIGS. 4B and 5E.

The first insulating layer 201 includes the gate insulating layer of each transistor, and also includes a dielectric layer 104 of the storage capacitor Cst. The polysilicon layer 102 is configured to form the first capacitor electrode 141, that is, the gate N3G of the storage transistor N3, the resistor R, and the gates P1G, N1G, and N2G of each transistor (P1, N1, N2).

As shown in FIGS. 4B and 5E, the gate P1G of the second data writing transistor P1 is located in the second region 402. The first data writing transistor N1, the gate N2G of the driving transistor N2, the first capacitor electrode 141, and the resistor R are formed in the first region 401 outside the N-type well region.

In some embodiments, as shown in FIGS. 4B and 5E, an orthographic projection of the first capacitor electrode 141 of each one of the four sub-pixels in each pixel unit group on the base substrate is located outside the second region 402 of the four sub-pixels and surrounds the N-type well region. For example, the N-type well region is rectangular, and the orthographic projection of the first capacitor electrode 141 of each sub-pixel on the base substrate surrounds one corner of the rectangle; for example, each first capacitor electrode 141 includes a concave structure, and a contour of the concave is roughly L-shaped, and one corner of the rectangle extends into the orthographic projection of the concave structure to match the L-shaped contour.

As shown in FIGS. 4B and 5E, the patterns of the polysilicon layers in the two sub-pixels adjacent in the first direction D1 are arranged symmetrically with respect to the symmetry axis along the second direction D2; the patterns of the polysilicon layers in the two adjacent sub-pixels adjacent in the second direction D2 are arranged symmetrically with respect to the symmetry axis along the first direction D1, that is, the patterns of the polysilicon layers are symmetrical patterns. In some embodiments, as shown in FIGS. 4B and 5E, the resistors of the sub-pixels adjacent in the first direction are arranged symmetrically with respect to the symmetry axis along the second direction, and the resistors of the sub-pixels adjacent in the second direction are arranged symmetrically with respect to the symmetry axis along the first direction. In some embodiments, the first capacitor electrodes of the sub-pixels adjacent in the first direction are arranged symmetrically with respect to the symmetry axis along the second direction, and the first capacitor electrodes of the sub-pixels adjacent in the second direction are arranged symmetrically with respect to the symmetry axis along the first direction.

In some embodiments, the gates of the first data writing transistor N1 and the second data writing transistor P1 of the two sub-pixels adjacent in the second direction D2 are arranged symmetrically with respect to the symmetry axis along the first direction D1. For example, the gates of the first data writing transistor N1 or the second data writing transistor P1 of the two sub-pixels adjacent in the second direction D2 are integrally formed.

In some embodiments, the gates of the first data writing transistor N1 and the second data writing transistor P1 of the two sub-pixels adjacent in the first direction D1 are arranged symmetrically with respect to the symmetry axis along the second direction D2.

In some embodiments, the first insulating layer 201 is formed on the base substrate by thermal oxidation. For example, a material of the first insulating layer is silicon nitride, oxide or oxynitride.

For example, a polysilicon material layer is formed on the first insulating layer by chemical vapor deposition (PVD), and then a photolithography process is performed on the polysilicon material layer to form the polysilicon layer 102.

Figure 5F:
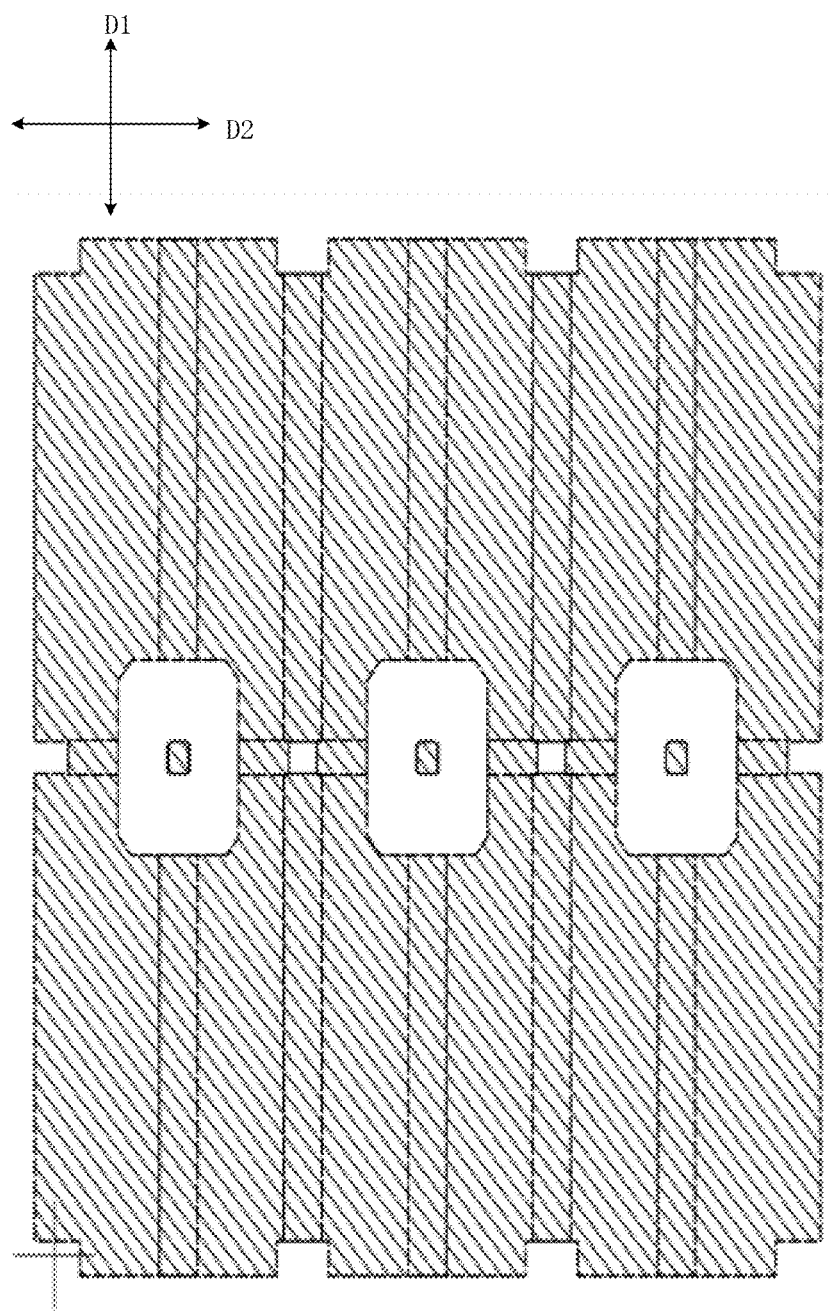
Figure 5G:
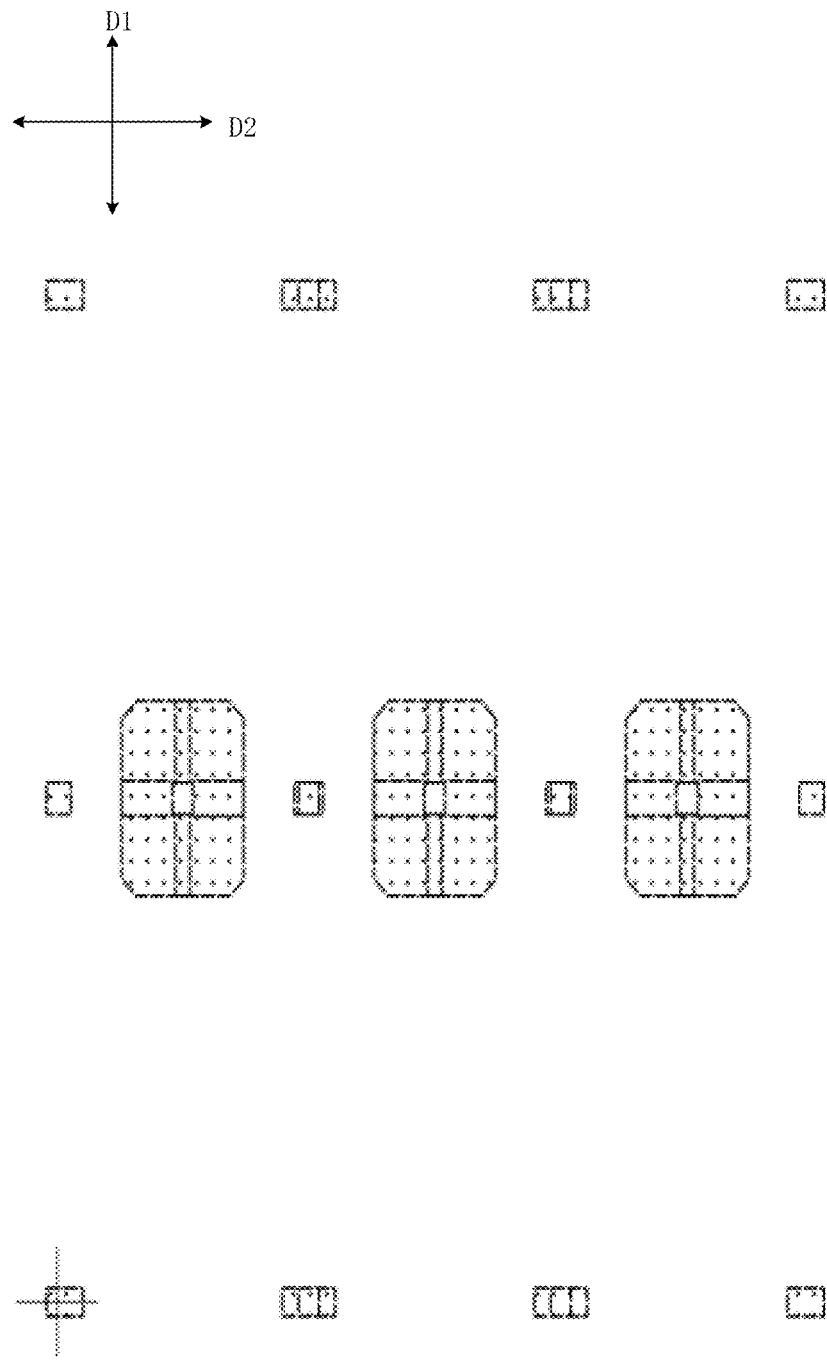
Figure 5H:
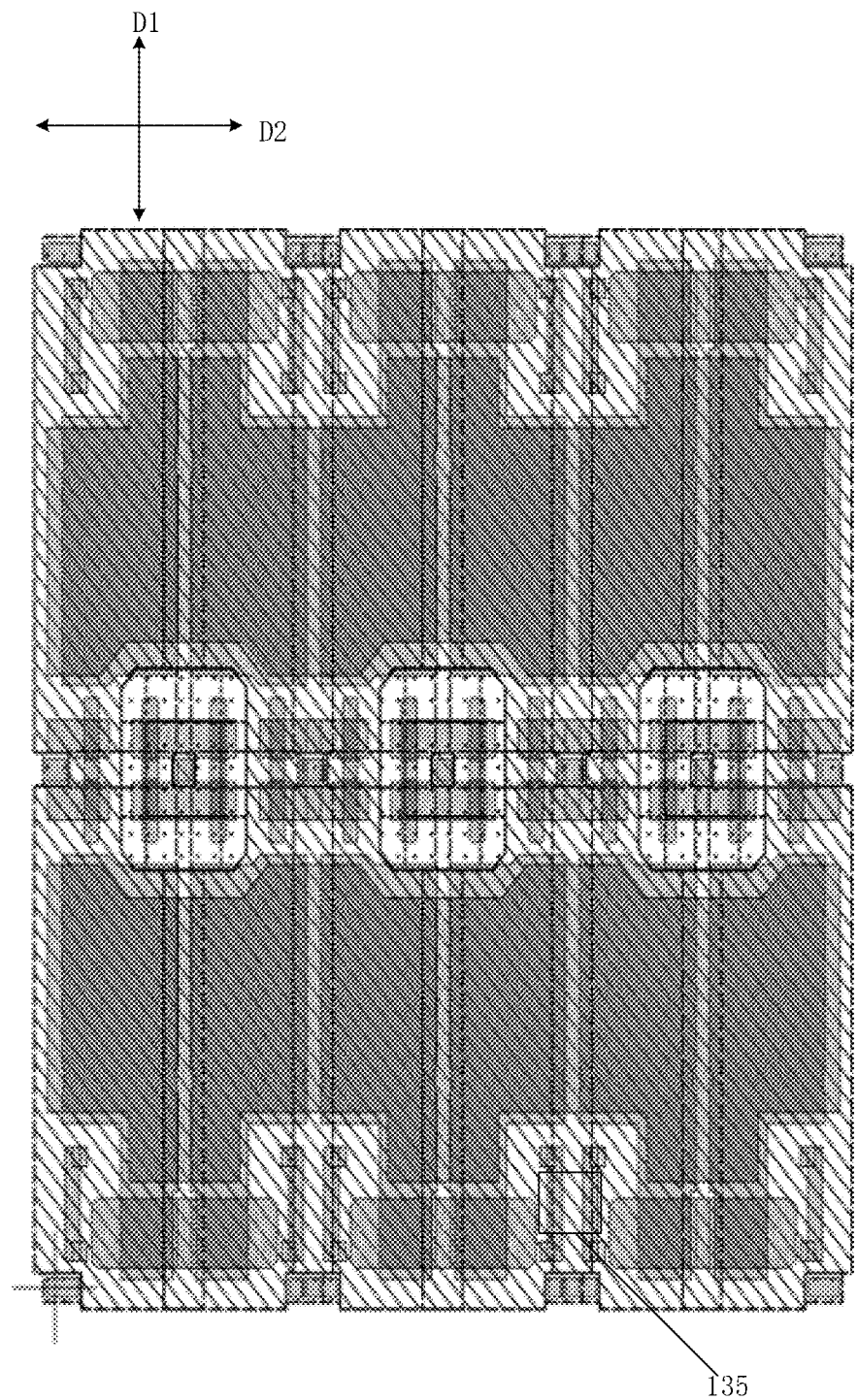

FIG. 5F shows a N-type heavily doped window region of the base substrate, FIG. 5G shows a P-type heavily doped window region of the base substrate, and FIG. 5H shows a schematic diagram of the substrate structure after the N-type heavy doping and the P-type heavy doping are completed in the substrate structure shown in FIG. 5E. In some embodiments, the N-type heavily doped window region is used to perform N-type heavy doping and the P-type heavily doped window region is used to perform P-type heavy doping on the base substrate on which the polysilicon layer 102 is formed, to form contact hole regions for electrical connection. For example, the doped window region includes the source region and the drain region of each transistor, thereby forming the first electrode such as the drain, and the second electrode such as the source of each transistor. In some embodiments, the doped window region further includes each contact hole region of the substrate and the contact hole region of the resistor R, for example, the contact hole regions 400a, 400b, 411, 133, 134 shown in FIG. 4B. In some embodiments, since the gate of the transistor is formed of a polysilicon material, the polysilicon gate also needs to be doped. During the doping, a barrier layer may be formed as needed to cover the undoped region, and only the corresponding doped window region is exposed.

It should be noted that FIG. 5F and FIG. 5G only illustrate each doped window region. When the doping process is actually performed, a corresponding barrier/mask layer is provided to expose the corresponding doped window region and the polysilicon region for doping. For example, a material of the barrier layer/mask layer may be a photoresist or an oxide material.

In some embodiments, when N-type heavy doping is performed, as shown in FIG. 5H, a barrier layer 135 is formed corresponding to the resistor R. In order to protect the resistance of the resistor R, the resistor R needs to be shielded during the N-type doping process, to prevent the resistor R from being damaged due to the doping. The barrier layer 135 covers a main body of the resistor R, and only exposes the contact hole regions 133 and 134 at both ends of the resistor R. Those skilled in the art should understand that FIG. 5H only shows the shielding layer 135 that shields the main body part of the resistor R in a pair of adjacent sub-pixels. Those skilled in the art may understand that for other sub-pixels, a barrier layer is also required to shield the main body part of the resistor R.

In some embodiments, the barrier layer 135 may be silicon nitride, oxide or oxynitride, or a photoresist material. After the doping process is completed, the barrier layer 135 may remain in the display panel or may be removed.

In some embodiments, the barrier layer 135 of the resistor R may also be formed together with barrier layers/mask layers in other regions during the doping, which is not limited in the embodiments of the present disclosure.

In some embodiments, during the doping process, N-type heavy doping and P-type heavy doping need to be performed separately, for example, to form the source and drain regions of the N-type transistor and the source and drain regions of the P-type transistor. When the N-type heavy doping process is performed, the barrier layer may be formed to block the region where the N-type heavy doping is not performed; when the P-type heavy doping process is performed, the barrier layer may be formed to shield the region where the P-type heavy doping is not performed.

In some embodiments, referring to FIG. 4B, the gates, the first electrode and the second electrode of the transistors N1-N3, and the contact hole regions 411, 133, and 134 may be formed through the N-type heavy doping process. The N-type doping process may be, for example, an ion implantation process, and a doping element may be, for example, boron. Through the P-type heavy doping process, the gate, the first electrode and the second electrode of the transistor P1, and the contact hole regions 400a and 400b may be formed. The P-type doping process may be, for example, an ion implantation process, and a doping element may be, for example, phosphorus element.

In the above-mentioned doping process, for example, an ion implantation process may be adopted, and the polysilicon pattern may be used as a mask, so that an implantation of ions into the silicon-based substrate just happens on both sides of the polysilicon, thereby forming the first electrode and the second electrode of each transistor, and a self-alignment is achieved. In addition, a resistivity of the polysilicon with higher resistance is reduced through the doping process, and the gate of each transistor and the first capacitor electrode may be formed. Therefore, using the polysilicon materials as materials of the resistor and the gate has a plurality of beneficial effects, and saves process costs.

In this way, the structure of the display panel shown in FIG. 4A is formed, including each transistor P1, N1, and N2, the resistor R, and the storage capacitor Cst.

In some embodiments, the corresponding transistors, resistors, and storage capacitors Cst in the two sub-pixels adjacent in the first direction D1 are arranged symmetrically with respect to the symmetry axis along the second direction D2, respectively. The corresponding transistors, resistors, and storage capacitors Cst in the two sub-pixels adjacent in the second direction D2 are arranged symmetrically with respect to the symmetry axis along the first direction D1, respectively.

It should be noted that, in this embodiment, the storage capacitor Cst is the storage transistor T3 being used as the capacitor. Specifically, the gate T3G of the storage transistor N3 is used as the first capacitor electrode 141, and the first electrode N3D, the second electrode N3S and the active region N3a between the first electrode and the second electrode are used as the capacitor. After a voltage is applied to the first capacitor electrode 141, a region of the base substrate 101 under the first capacitor electrode 1411 generates inversion charges, so that the first electrode N3D, the second electrode N3S and the active area N3a between the first electrode and the second electrode of the memory transistor N3 are formed as a conductor structure.

In some embodiments, the orthographic projection of the first capacitor electrode 141 on the base substrate 101 and the orthographic projection of the second capacitor electrode 142 on the base substrate 101 have an overlapping region, and the overlapping region includes a first protrusion protruding toward the driving transistor and a second protrusion protruding toward the first data writing transistor N1.

A second insulating layer 202, a first conductive layer 301, a third insulating layer 203, a second conductive layer 302, a fourth insulating layer 204, a third conductive layer 303, a fifth insulating layer 205 and a fourth conductive layer 304 are sequentially formed on the substrate shown in FIG. 4A, such that the display panel shown in FIG. 3A is formed.

Figure 6A:
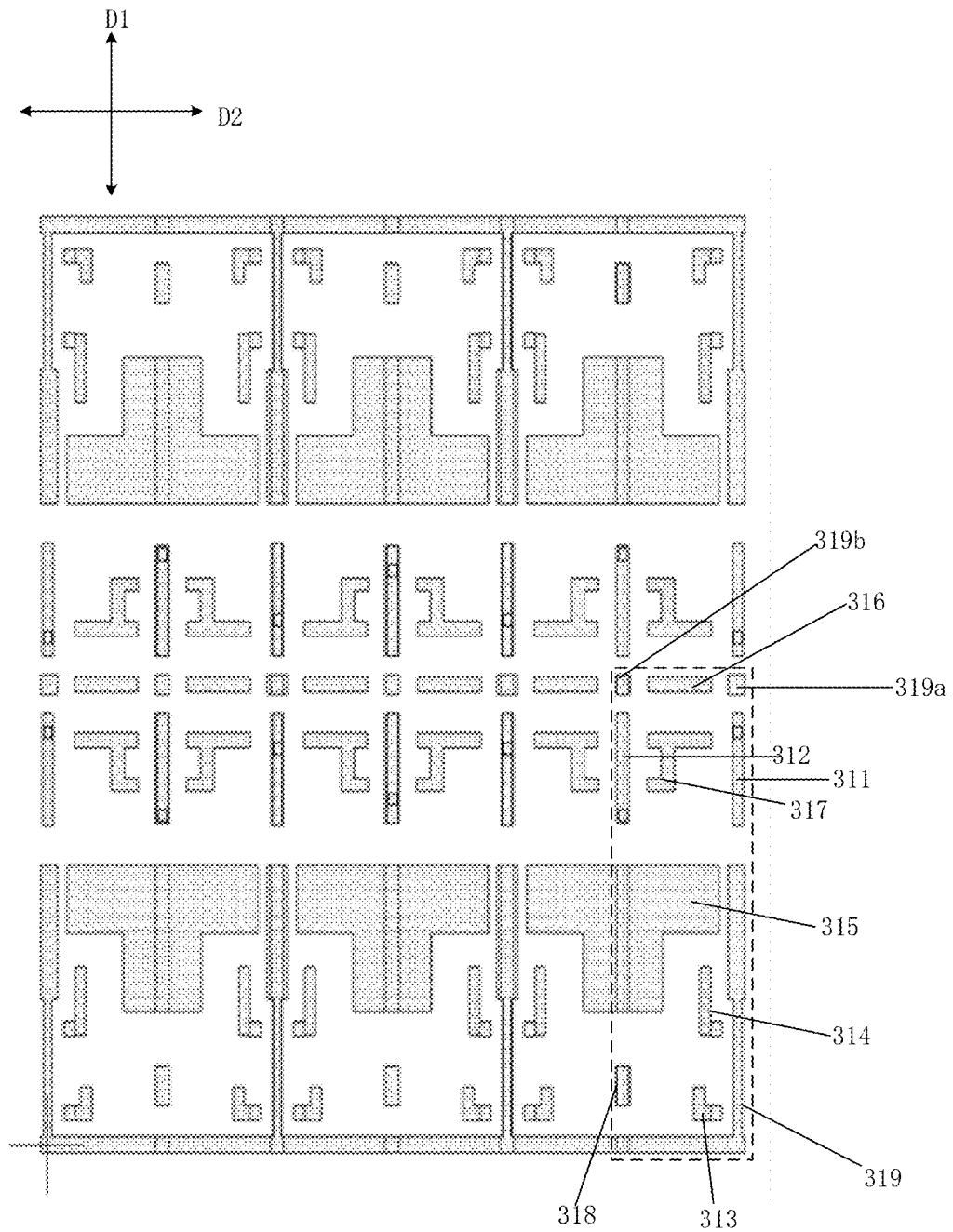
FIG. 6A-6B are schematic diagrams of a first conductive layer of a display panel provided by some embodiments of the present disclosure.
Figure 6B:
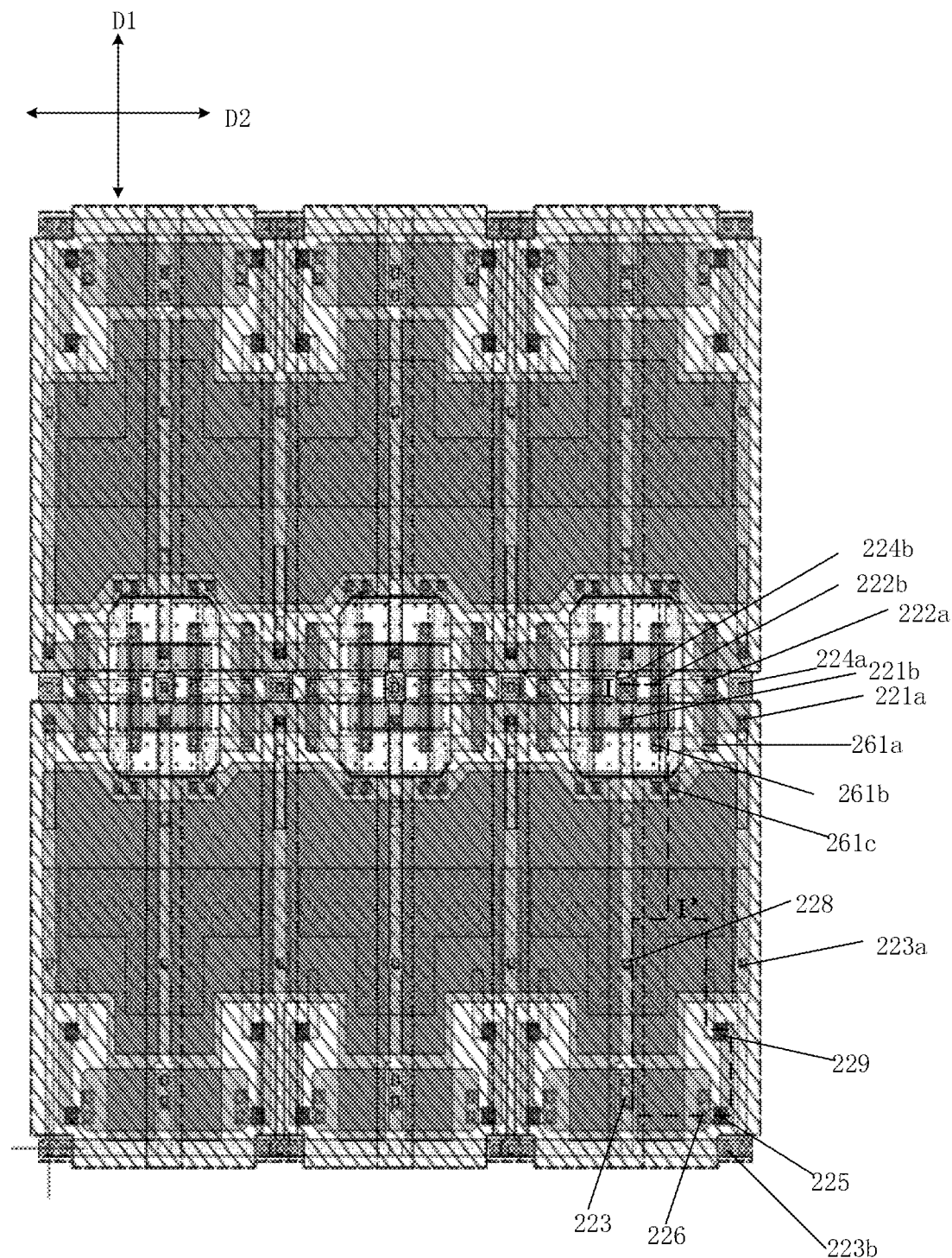

FIGS. 6A and 6B respectively show a pattern of the first conductive layer 301 and a situation in which the first conductive layer 301 is disposed on the substrate structure shown in FIG. 4A. FIG. 6B also shows via holes in the second insulating layer 202, the via holes correspond to each contact region in FIG. 4B one-to-one, and is used to electrically connect each contact hole region with the pattern in the first conductive layer 301. For clarity, only two rows and six columns of sub-pixels are shown in the drawing, and a region of one sub-pixel 100 is shown by a dashed frame. In addition, FIG. 6B also shows a location of the section line I-I' in FIG. 3A correspondingly.

As shown in FIG. 6A, the patterns of the first conductive layer in the two sub-pixels adjacent in the first direction D1 are arranged symmetrically with respect to the symmetry axis along the second direction D2. In the two adjacent sub-pixels in the second direction D2 the patterns of the first conductive layer in the two sub-pixels adjacent in the second direction D2 are arranged symmetrically with respect to the symmetry axis along the first direction D1. The pattern of the first conductive layer will be exemplarily described below by taking one sub-pixel as an example.

As shown in FIG. 6A, the first conductive layer 301 includes a connecting electrode 313 for electrically connecting the first terminal 131 of the resistor R with the second electrode N2S of the driving transistor N2.

In some embodiments, referring to FIG. 6B, the connecting electrode 313 is L-shaped as a whole, and it includes a first part extending along the first direction D1 and a second part extending from the first portion along the second direction D2 toward the resistor R. A free end of the second part of the connecting electrode 313 is electrically connected to the first terminal 131 of the resistor R through a via hole 225 in the second insulating layer 202. The first part of the connecting electrode 313 is electrically connected to the second electrode N2S of the driving transistor N2 through a via hole 226. In some embodiments, an orthographic projection of the connecting electrode 313 on the base substrate 101 falls within an orthographic projection of the second electrode N2S of the driving transistor N2 on the base substrate 101.

In some embodiments, the number of the via holes 226 may be one or more, as shown in FIG. 6B, for example, the number is two, to reduce the contact resistance.

In some embodiments, referring to FIGS. 6A and 6B in conjunction, the first conductive layer 301 further includes a connecting electrode 314. The connecting electrode is electrically connected to the second terminal 132 of the resistor R through a via hole 229 in the second insulating layer 202. The connecting electrode 314 is also electrically connected to the first electrode 121 of the light-emitting element 120. For example, the connecting electrode 314 is L-shaped, one branch of which is electrically connected to the second end 132 of the resistor R, and the other branch is electrically connect to the first electrode 121 of the light-emitting element 120.

In some embodiments, as shown in FIGS. 6A and 6B, the first conductive layer 301 further includes a third capacitor electrode 315. The third capacitor electrode 315 completely overlaps with the first capacitor electrode 141 and the second capacitor electrode 142 in a direction perpendicular to the base substrate 101. The third capacitor electrode 315 is located on a side of the first capacitor electrode 141 away from the second capacitor electrode 142, and is configured to be electrically connected to the second capacitor electrode 142. That is, in the direction perpendicular to the base substrate, the second capacitor electrode 142 and the third capacitor electrode 315 are respectively located on both sides of the first capacitor electrode 141, and are electrically connected to each other, thereby forming a structure of parallel capacitors, and increasing the capacitance value of the storage capacitor Cst.

In some embodiments, as shown in FIG. 6A and FIG. 6B, the third capacitor electrode 315 is electrically connected to the first electrode N3D of the storage transistor N3 through a via hole 228 in the second insulating layer 202, so as to be electrically connected to the second capacitor electrode 142. The third capacitor electrode 315 is substantially L-shaped, and includes a first part extending along the first direction D1 and a second part extending from the first portion along the second direction D2 toward the second electrode N3S of the storage transistor N3.

As shown in FIGS. 4B, 6A, and 6B, a width in the first direction D1 of a part of the third capacitor electrode 315 close to the first region of the second capacitor electrode 142 is larger than a width in the first direction D1 of a part of the third capacitor electrode 315 close to the third region of the second capacitor electrode.

In some embodiments, in the first direction D1, the via hole 228 is closer to the driving transistor N2 and farther away from the data writing sub-circuit, that is, an orthographic projection of a distance between the via hole 228 and the driving transistor N2 in the first direction D1 is smaller than an orthographic projection of a distance between the via hole 228 and the data writing sub-circuit in the first direction D1. Therefore, a voltage of the driving transistor may be better maintained.

In some embodiments, the third capacitor electrodes 315 of two sub-pixels adjacent in the first direction D1 are arranged symmetrically with respect to the symmetry axis along the second direction D2. The third capacitor electrodes 315 of two sub-pixels adjacent in the second direction D2 are arranged symmetrically with respect to the symmetry axis along the first direction D1. For two sub-pixels adjacent in the second direction D2 in one pixel group, the third capacitor electrodes 315 of the two are an integral structure, that is, the first parts of the third capacitor electrodes 315 are connected integrally.

In some embodiments, the first conductive layer 301 further includes a connecting electrode 317 for electrically connecting the second terminal of the data writing sub-circuit with the first terminal of the storage sub-circuit, that is, electrically connecting the first electrode N1D of the writing transistor N1 and the first electrode P1G of the second data writing transistor P1 with the first capacitor electrode 141.

Referring FIGS. 6A and 6B in conjunction, the connecting electrode 317 is, for example, an h-shaped structure, and includes a first part and a second part extending in parallel along the second direction D2, and a third part connecting the first part and the second part, the third part extends along the first direction D1, and the third part connects a middle part of the first part and an end portion of the second part. A first terminal of the first part of the connecting electrode 317 is electrically connected to the first electrode N1D of the first data writing transistor N1 through a via hole 261a in the second insulating layer 202, a second terminal of the first part of the connecting electrode 317 is electrically connected to the first electrode P1D of the second data writing transistor P1 through a via hole 261b in the second insulating layer 202, and the second part of the connecting electrode 317 is electrically connected to the first capacitor electrode 141 through a via hole 261c in the second insulating layer 202. In some embodiments, the number of the via hole 261c may be one or more, as shown in FIG. 6B, for example, the number is two, to reduce the contact resistance.

In some embodiments, in the second direction D2, the via hole 261c is closer to the first region of the second capacitor electrode 142 and farther away from the third region of the second capacitor electrode, that is, a distance between the via hole 261c and the first region is smaller than a distance between the via hole 261c and the third region.

Referring to FIGS. 6A and 6B in conjunction, the first conductive layer 301 further includes a first scan line connecting portion 311 and a second scan line connecting portion 312. The first scan line connecting portion 311 is used to be electrically connected to the first scan line, so that the gate of the first data writing transistor N1 receives the first control signal SEL. The second scan line connecting portion 312 is used to be electrically connected to the second scan line, so that the gate of the second data writing transistor P1 receives the second control signal SEL_B.

In some embodiments, the first scan line connecting portion 311 is electrically connected to the gate N1G of the first data writing transistor N1 through a via hole 221a in the second insulating layer 202, and the second scan line connecting portion 312 is electrically connected to the gate P1G of the second data writing transistor P1 through a via hole 221b in the insulating layer 202.

In some embodiments, as shown in FIGS. 6A and 6B, the sub-pixels adjacent in the second direction D1 share the first scan line connecting portion 311 or the second scan line connection porting 312.

As shown in FIG. 6A, the first conductive layer 301 further includes a data line connecting portion 316, which is used to be electrically connected to the data line, so that the second electrode N1S of the first data writing transistor N1 and the second electrode P1S of the second data writing transistor P1 receive the data signal Vd transmitted by the data line.

As shown in FIG. 6B, the data line connecting portion 316 has an elongated shape extending along the second direction D2, and a first terminal of the data line connecting portion 316 is electrically connected to the second electrode N1S of the first data writing transistor N1 through a via hole 222a in the second insulating layer 202, and a second terminal is electrically connected to the second electrode P1S of the second data writing transistor P1 through a via hole 222b in the second insulating layer 202.

In some embodiments, as shown in FIG. 6A, a plurality of data line connecting portions 316 are arranged at intervals in the second direction D2, for example, at a boundary of two sub-pixel rows. For example, the two sub-pixels adjacent in the first direction D1 share one data line connecting portion 316.

Referring to FIGS. 6A and 6B, the first conductive layer 301 further includes a connecting electrode 318, the connecting electrode 318 is electrically connected to the first electrode N2D of the driving transistor N2 through a via hole 223 in the second insulating layer 202, and the connecting electrode 318 is configured to introduce the first power source voltage VDD to the first electrode N2D of the driving transistor N2.

Referring to FIGS. 6A and 6B, the first conductive layer 301 further includes a connecting electrode 319. The connecting electrode 319 is L-shaped and includes a first part extending in the first direction D1 and a second part extending in the second direction D2. The first part of the connecting electrode 319 includes a first section and a second section with different widths, wherein two ends of the second section are respectively connected to the first section and the second part, and a width of the first section is wider than that of the second section. The first section of the first part of the connecting electrode 319 is electrically connected to the second electrode N3S of the storage transistor N3 through a via hole 223a in the second insulating layer 202, and is configured to introduce the ground voltage GND to the second electrode N3S of the storage transistor N3. A corner of the L-shaped connecting electrode 319 is electrically connected to the contact hole region 400a on the P-type substrate through a via hole 223b in the second insulating layer 202, and is used to connect the P-type substrate to the ground voltage GND. The substrate bias is low pressure.

In some embodiments, referring to FIGS. 6A and 6B, for any row of sub-pixels, the second parts of the connecting electrodes 319 are connected to form an integral structure. For two sub-pixels adjacent in the first direction D1, when the two adjacent sub-pixels are located in different pixel groups, they share the second part of the connecting electrode 319. For two sub-pixels adjacent in the second direction D2, when the two adjacent sub-pixels are located in different pixel groups, they share the first part of the connecting electrode 319.

Referring to FIGS. 4A and 6B, the first conductive layer 301 further includes connecting electrodes 319a, 319b. These connecting electrodes are provided for biasing the substrate of the transistor, for example, for connecting the N-type substrate to the first power source voltage terminal to receive the first power supply voltage VDD (high voltage), or for connecting the P-type substrate to the ground voltage terminal to receive the ground voltage GND (low voltage), thereby avoiding parasitic effects such as offset effects, and improving the circuit stability.

Referring to FIG. 4B, the connecting electrodes 319a, 319b are electrically connected to the contact hole regions 400b, 411 in the base substrate 101 through via holes 224a, 224b in the second insulating layer 202, respectively. The connecting electrode 319a is used to be connected to the ground voltage GND to bias the P-type substrate where the first data writing transistor N1 is located. The connecting electrode 319b is used to be connected to the first power source voltage VDD to bias the N-type substrate where the second data writing transistor Plis located.

Figure 7A:
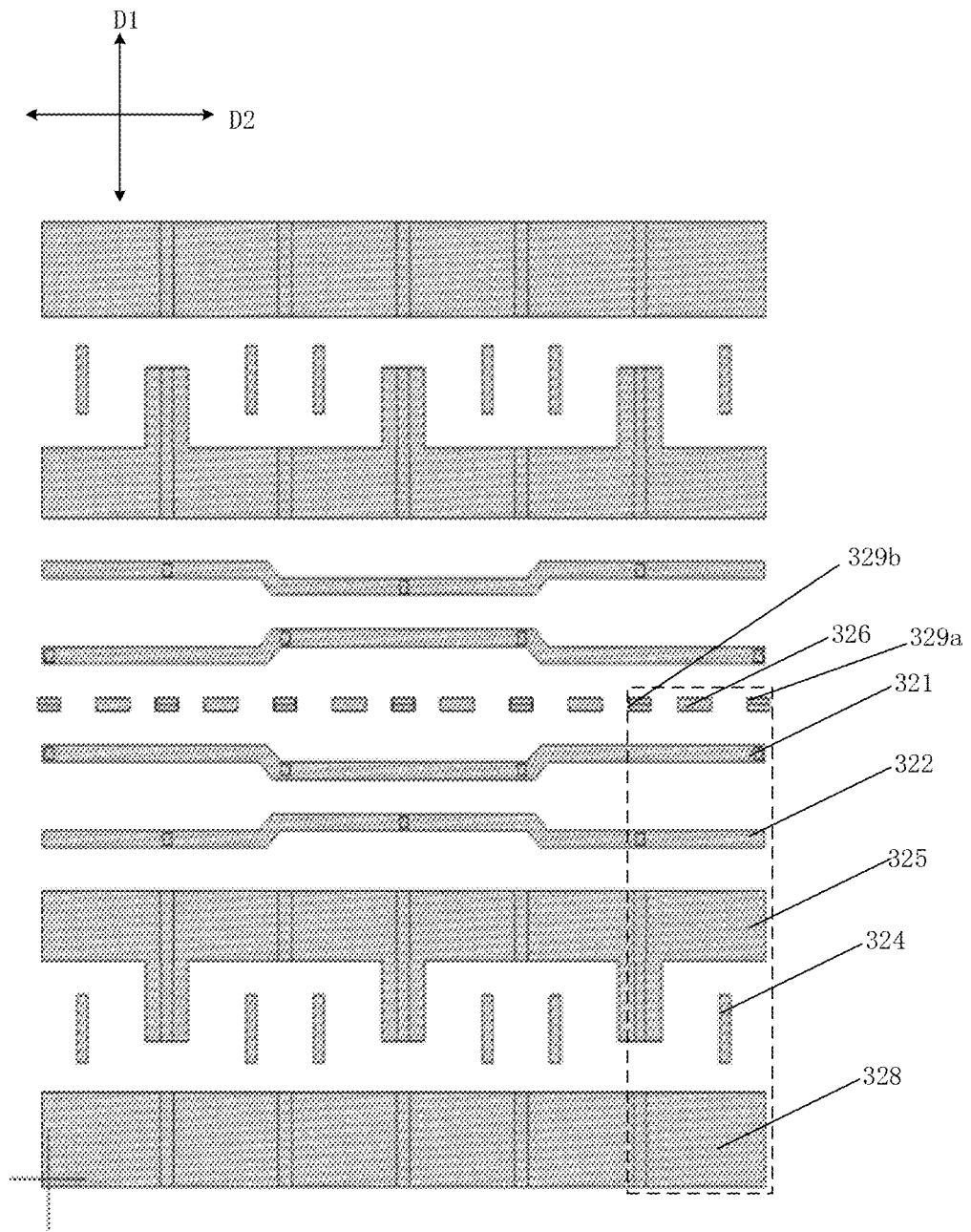
FIG. 7A-7B are schematic diagrams of a second conductive layer of a display panel provided by some embodiments of the present disclosure.
Figure 7B:
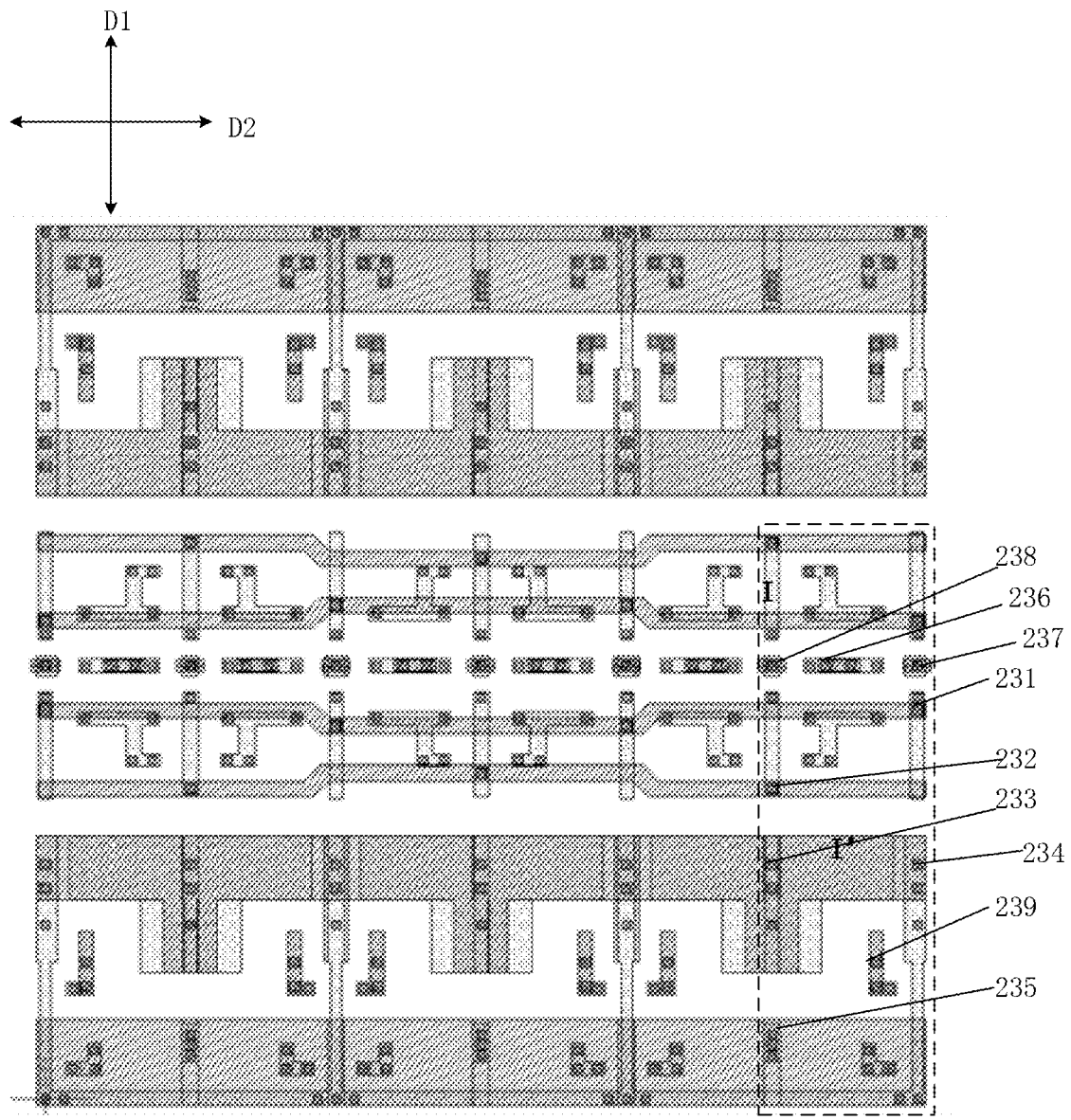

FIG. 7A shows a schematic diagram of a second conductive layer 302, FIG. 7B shows the second conductive layer 302 on the basis of the first conductive layer 301, and FIG. 7B also shows via holes in the third insulating layer 203. The via holes in the third insulating layer 203 are used to connect the pattern in the first conductive layer 301 and the pattern in the second conductive layer 302. For clarity, only two rows and six columns of sub-pixels are shown in the drawing, and a region of one sub-pixel 100 is shown by a dashed frame. Those skilled in the art may understand that each layer structure before forming the first conductive layer 301 is omitted in FIG. 7B.

As shown in FIG. 7A, patterns of the second conductive layer in the two sub-pixels adjacent in the first direction D1 are arranged symmetrically with respect to the symmetry axis along the second direction D2; and patterns of the second conductive layer in the two sub-pixels adjacent in the second direction D2 are arranged symmetrically with respect to the symmetry axis along the first direction D1. The pattern of the second conductive layer will be exemplarily described below by taking one sub-pixel as an example.

As shown in FIGS. 7A and 7B, the second conductive layer 302 includes a connecting electrode 324 which is electrically connected to the connecting electrode 314 in the first conductive layer 301 through a via hole 239 in the third insulating layer 203. The connecting electrode 324 is used to be electrically connected to the first electrode 121 of the light-emitting element 120. For example, the connecting electrode 324 has an elongated shape extending along the first direction D1.

In some embodiments, the number of the via hole 239 may be one or more, as shown in FIG. 7B, for example, the number is two, to reduce the contact resistance.

In some embodiments, an orthographic projection of the connecting electrode 324 on the base substrate 101 substantially falls within the orthographic projection of the connection electrode 314 on the base substrate 101. For example, the orthographic projection of the connection electrode 324 on the base substrate 101 and the orthographic projection of a branch of the connection electrode 314 extending along the first direction D1 on the base substrate 101 substantially coincide.

As shown in FIGS. 4B, 7A, and 7B, for each row of sub-pixels, the second conductive layer 302 includes a first scan line 321, a second scan line 322, a grounding line 325, and a power line 328 extending along the second direction D2. The first scan line 321 is configured to transmit the first scan signal SEL, the second scan line 322 is configured to transmit the second scan signal SEL_B, the grounding line 325 is configured to transmit the ground voltage GND, and the power line 328 is configured to transmit the first voltage signal VDD. The first scan line 321, the second scan line 322, the grounding line 325, and the power line 328 are sequentially farther away from a center of each N-type well region of the row of sub-pixels in the first direction D1.

In some embodiments, for any two adjacent rows of sub-pixels, each of the first scan lines 321, the second scan lines 322, the grounding lines 325, and the power lines 328 are arranged symmetrically with respect to the symmetry axis along the second direction D2.

Referring to FIGS. 7A and 7B in conjunction, the first scan line 321 is electrically connected to the first scan line connecting portion 311 in the first electrode layer 301 through a via hole 231 in the third insulating layer 203, and is used to provide the gate N1G of the data writing transistor N1 with the first scan signal SEL. The second scan line 322 is electrically connected to the second scan line connecting portion 312 in the first electrode layer 301 through a via hole 232 in the third insulating layer 203, and is used to provide the gate P1G of the second data writing transistor P1 with the first scan signal SEL_B.

The first scan line 321 and the second scan line 322 both wind and extend along the second direction D2, and in one row of sub-pixels, the first scan line 321 and the second scan line 322 are symmetrical with respect to the symmetry axis along the second direction D2.

For two sub-pixels adjacent in the second direction D2, if the two adjacent sub-pixels are located in one pixel group, a distance between parts of the first scan line 321 and the second scan line 322 of the two sub-pixels that are parallel to each other is the same. If the two adjacent sub-pixels are located in different pixel groups, the distance between parts of the first scan line 321 and the second scan line 322 of the two sub-pixels that are parallel to each other is different.

Referring to FIGS. 7A and 7B in conjunction, a grounding line 325 is electrically connected to the third capacitor electrode 315 in the first electrode layer 301 through a via hole 233 in the third insulating layer 203, and is electrically connected to the first part of the connecting electrode 319 in the first electrode layer 301 extending along the first direction D1 through a via hole 234 in the third insulating layer 203, so that the first electrode N3D and the second electrode N3S of the storage transistor N3 are electrically connected, and both are connected to the ground voltage GND.

In each sub-pixel 100, the grounding line 325 is substantially L-shaped, and includes a first part extending in the first direction D1 and a second part extending from the first part in the second direction D2 toward the second electrode N3S of the storage transistor N3. An orthographic projection of the grounding line 325 on the base substrate 101 partially overlaps with an orthographic projection of the third capacitor electrode 315 on the base substrate 101. As shown in FIG. 7B, an projection of the first part of the grounding line 325 on the base substrate 101 falls within an orthographic projection of the first part of the third capacitor electrode 315 on the base substrate 101, and an orthographic projection of the second part of the grounding line 325 on the base substrate 101 is covered in an orthographic projection of the second part of the third capacitor electrode 315 on the substrate 101.

Referring to FIGS. 7A and 7B in conjunction, the power line 328 is electrically connected to the connecting electrode 318 in the first conductive layer 301 through a via hole 235 in the third insulating layer 203, and is used to provide the first electrode N2D of the driving transistor N2 with the first voltage signal VDD through the connecting electrode 318.

In each sub-pixel unit, an orthographic projection of the power line 328 on the base substrate covers the orthographic projection of the driving transistor N2 on the base substrate 101, so that the driving transistor N2 may be shielded from external interference and a normal operation of the driving transistor N2 may be ensured.

In some embodiments, as shown in FIG. 7A, the power line 328 is an elongated structure extending along the second direction D2.

Referring to FIGS. 7A and 7B in conjunction, the second conductive layer 302 further includes a data line connecting portion 326. The data line connecting portion 326 is used to be electrically connected to the data line, and is electrically connected to the data line connecting portion 316 in the first conductive layer 301 through a via hole 236, so that the second electrode N1S of the first data writing transistor N1 and the second electrode P1S of the second data writing transistor P1 receive the data signal Vd transmitted by the data line.

As shown in FIG. 7B, the data line connection portion 326 has an elongated shape extending along the second direction D2, and an orthographic projection of the data line connecting portion 326 on the base substrate 101 falls within an orthographic projection of the data line connecting portion 316 on the base substrate 101.

Referring to FIGS. 7A and 7B in combination, the second conductive layer 302 further includes connecting electrodes 329a and 329b, and these connecting electrodes are all provided for biasing the substrate of the transistor. For example, they are used to connect the N-type substrate to the first power source voltage terminal to receive the first power supply voltage VDD (high voltage), or to connect the P-type substrate to the ground voltage terminal to receive the ground voltage GND (low voltage), thereby avoiding parasitic effects such as the offset effects, and improving the circuit stability.

Referring to FIGS. 4B, 7A, and 7B, the connecting electrodes 329a, 329b are electrically connected to the connecting electrodes 319a, 319b in the first conductive layer through via holes 237, 238 in the third insulating layer 203, respectively, then are electrically connected to the contact hole regions 400b and 411 in the base substrate 101, respectively. The connecting electrode 329a is used to be connected to the ground voltage GND to bias the P-type substrate where the first data writing transistor N1 is located. The connecting electrode 329b is used to be connected to the first power source voltage VDD to bias the N-type substrate where the second data writing transistor P1 is located.

Figure 8A:
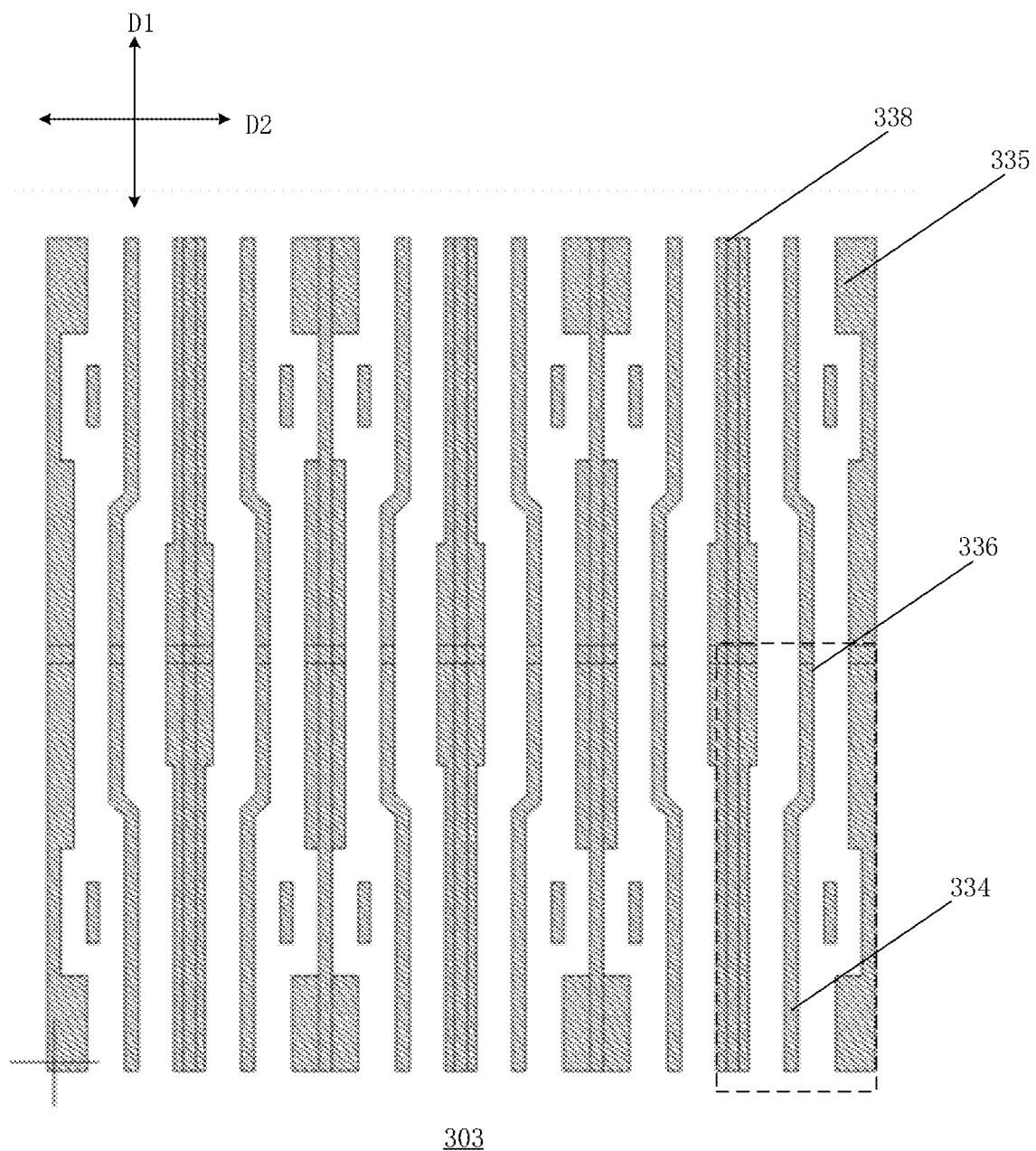
FIG. 8A-8B are schematic diagrams of a third conductive layer of a display panel provided by some embodiments of the present disclosure.
Figure 8B:
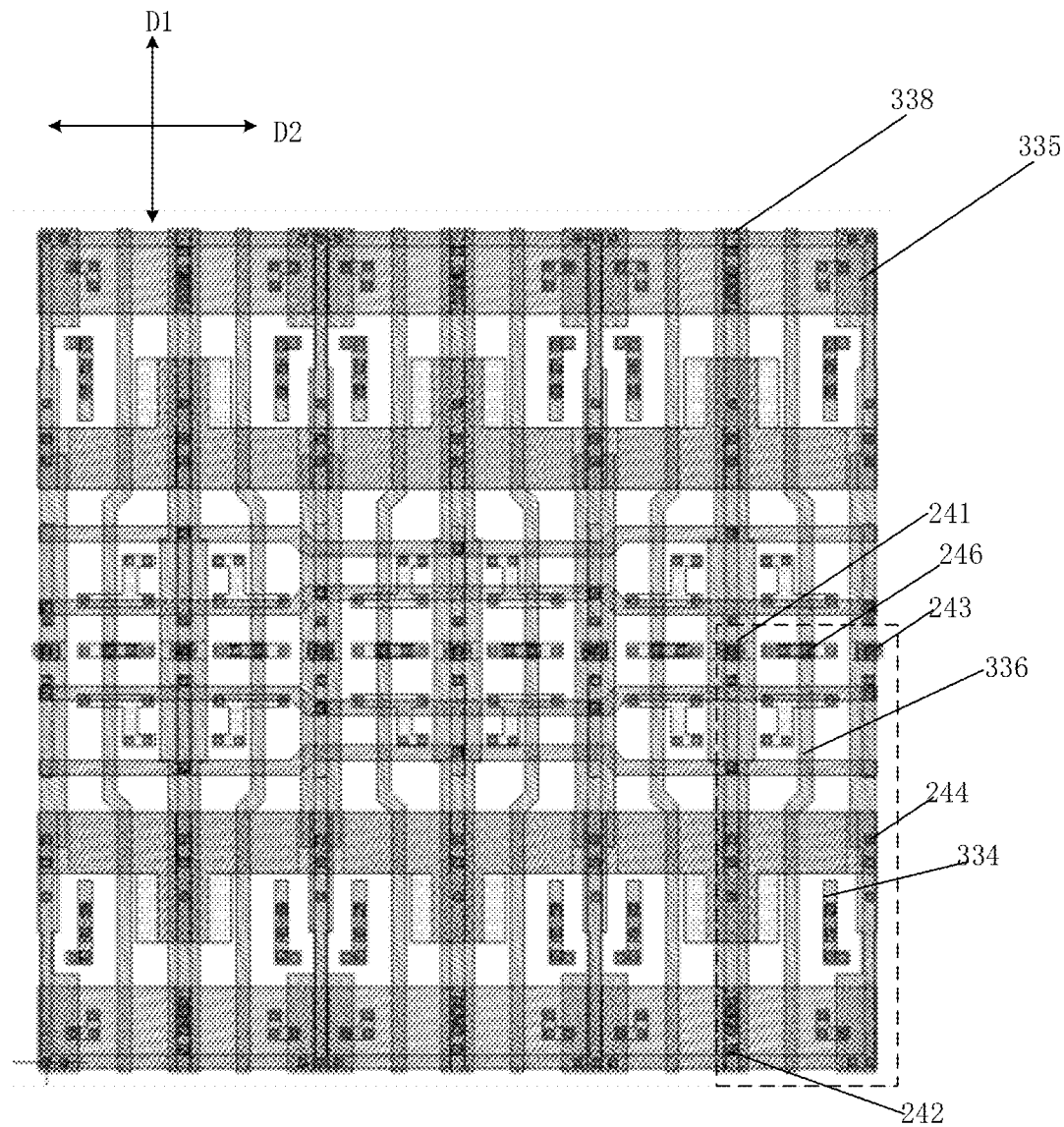

FIG. 8A shows a schematic diagram of a third conductive layer 303, FIG. 8B shows the third conductive layer 303 on the basis of the second conductive layer 302, and FIG. 8B also shows via holes in the fourth insulating layer 204. The via holes in the fourth insulating layer 204 are used to connect the pattern in the second conductive layer 302 and the pattern in the third conductive layer 303. For clarity, only two rows and six columns of sub-pixels are shown in the drawing, and a region of one sub-pixel 100 is shown by a dashed frame. Those skilled in the art may understand that each layer structure before forming the first conductive layer 301 is omitted in FIG. 8B.

As shown in FIGS. 8A and 8B, the third conductive layer 303 includes a connecting electrode 334 that is electrically connected to the connecting electrode 324 in the second conductive layer 302 through a via hole 249 in the fourth insulating layer 204, and the connection electrode 334 is used to be electrically connected to the first electrode 121 of the light-emitting element 120. For example, the connecting electrode 334 has an elongated shape extending along the first direction D1. In some embodiments, an orthographic projection of the connection electrode 334 on the base substrate 101 partially overlaps with an orthographic projection of the connection electrode 324 on the base substrate 101.

In some embodiments, the number of the via hole 249 may be one or more, as shown in FIG. 8B, for example, the number is two, to reduce the contact resistance.

As shown in FIGS. 4B, 8A, and 8B, the third conductive layer 303 includes a plurality of power lines 338, a plurality of data lines 336, and a plurality of grounding lines 335 extending along the first direction D1. The plurality of power lines 338, the plurality of data lines 336, and the plurality of grounding lines 335 are alternately arranged along the second direction D2. The grounding line 335 is configured to transmit the ground voltage GND, the power line 338 is configured to transmit the first voltage signal VDD, and the data line 336 is configured to transmit the data line signal Vd.

As shown in FIGS. 4B, 8A, and 8B, each column of sub-pixels corresponds to a data line 336, a power line 338, and a grounding line 335. For a column of sub-pixels, the data line 336 runs over the corresponding column of sub-pixels along the first direction D1, and the power line 338 and the grounding line 335 are respectively arranged on both sides of the data line 336.

As shown in FIGS. 4B, 8A, and 8B, any two adjacent columns of sub-pixels share a power line 338 or a grounding line 335.

Referring to FIGS. 8A and 8B in conjunction, the data line 336 is electrically connected to the data line connecting portion 326 in the second conductive layer 302 through a via hole 246 in the fourth insulating layer 204, so that the second electrode N1S of the first data writing transistor N1 and the second electrode P1S of the second data writing transistor P1 receive the data signal Vd transmitted by the data line. In some embodiments, the data line 336 winds and extends along the first direction D1, so that a predetermined distance is maintained between the data line 336 and the power line 338, between the data line and the grounding line 335 and between the data line and the connecting electrode 334 that are arranged in the same layer, so as to avoid the data line 336 from being too close to any one of the power line 338, the grounding line 335, and the connecting electrode 334 that are arranged in the same layer, which will adversely affect the transmission of the data signal Vd.

Referring to FIGS. 8A and 8B in conjunction, the power line 338 is electrically connected to the connecting electrode 329b in the second conductive layer 302 through a via hole 241 in the fourth insulating layer 204, and is used to introduce the first power supply voltage VDD to bias the N-type substrate of the second data writing transistor P1. The power line 338 is also electrically connected to the power line 328 in the second conductive layer 302 through a via hole 242 in the fourth insulating layer 204. In some embodiments, the number of the via hole 242 may be one or more, as shown in FIG. 8B, for example, the number is three, to reduce the contact resistance.

As shown in FIG. 8B, the power line 338 in the third electrode layer 303 and the power line 328 in the second electrode layer 302 are electrically connected to each other, and the plurality of power lines 328 extending in the first direction D1 and the plurality of power lines 328 extending in the second direction D2 form a grid structure, to provide each sub-pixel with the first power voltage VDD.

Referring to FIGS. 8A and 8B in conjunction, the grounding line 335 is electrically connected to the connecting electrode 329a in the second conductive layer 302 through a via hole 243 in the fourth insulating layer 204, for introducing a ground voltage GND to bias the P-type substrate of the first data writing transistor N1. The grounding line 335 is also electrically connected to the grounding line 325 in the second conductive layer 302 through a via hole 244 in the fourth insulating layer 204. In some embodiments, the number of the via hole 244 may be one or more, as shown in FIG. 8B, for example, the number is two, to reduce the contact resistance.

As shown in FIG. 8B, the grounding line 335 in the third electrode layer 303 and the grounding line 325 in the second electrode layer 302 are electrically connected to each other. The plurality of grounding lines 335 extending in the first direction D1 and the plurality of grounding lines 325 extending in the second direction D2 form a grid structure, to provide each sub-pixel with the ground voltage GND.

Figure 9A:
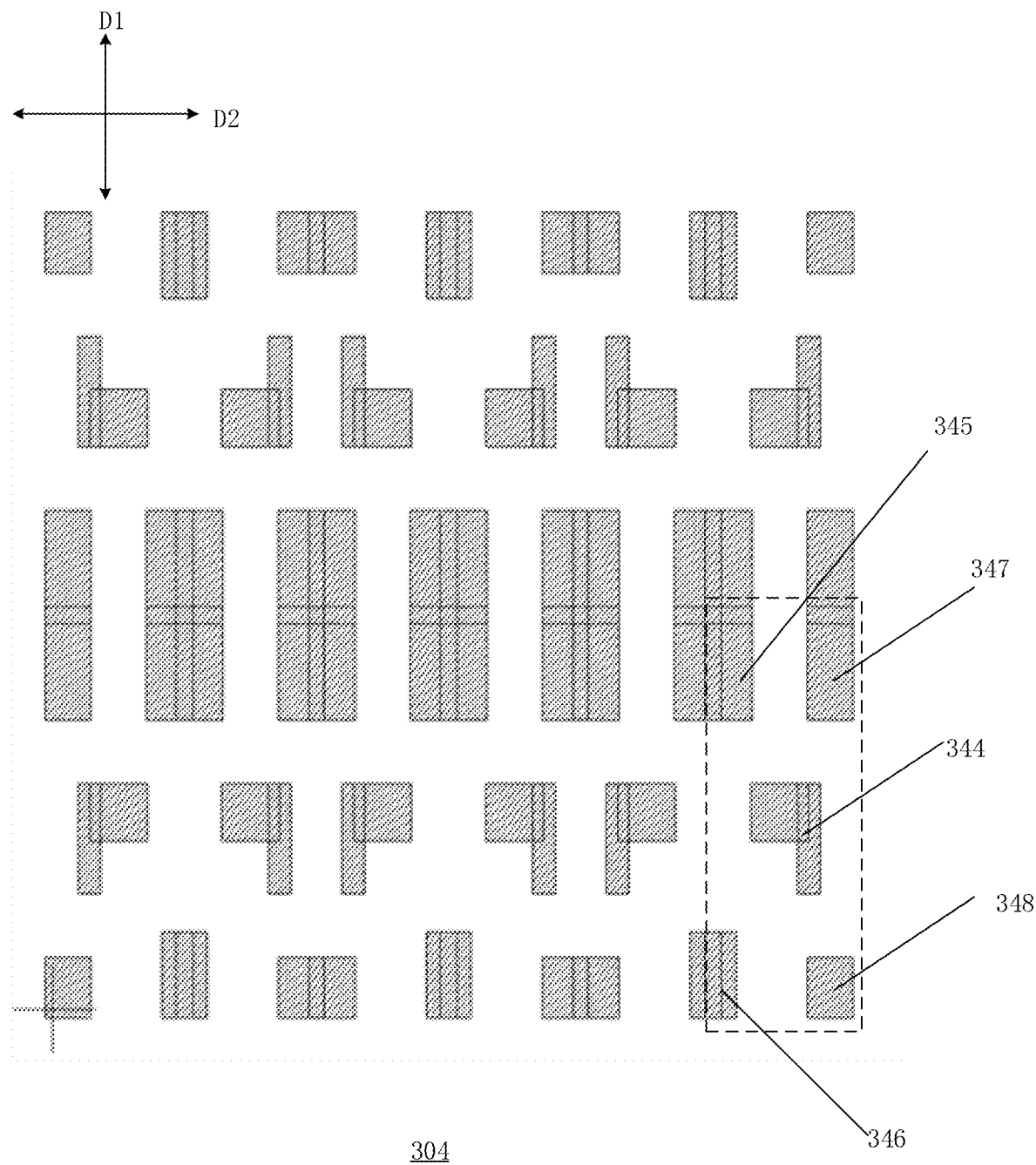
FIG. 9A-9B are schematic diagrams of a fourth conductive layer of a display panel provided by some embodiments of the present disclosure.
Figure 9B:
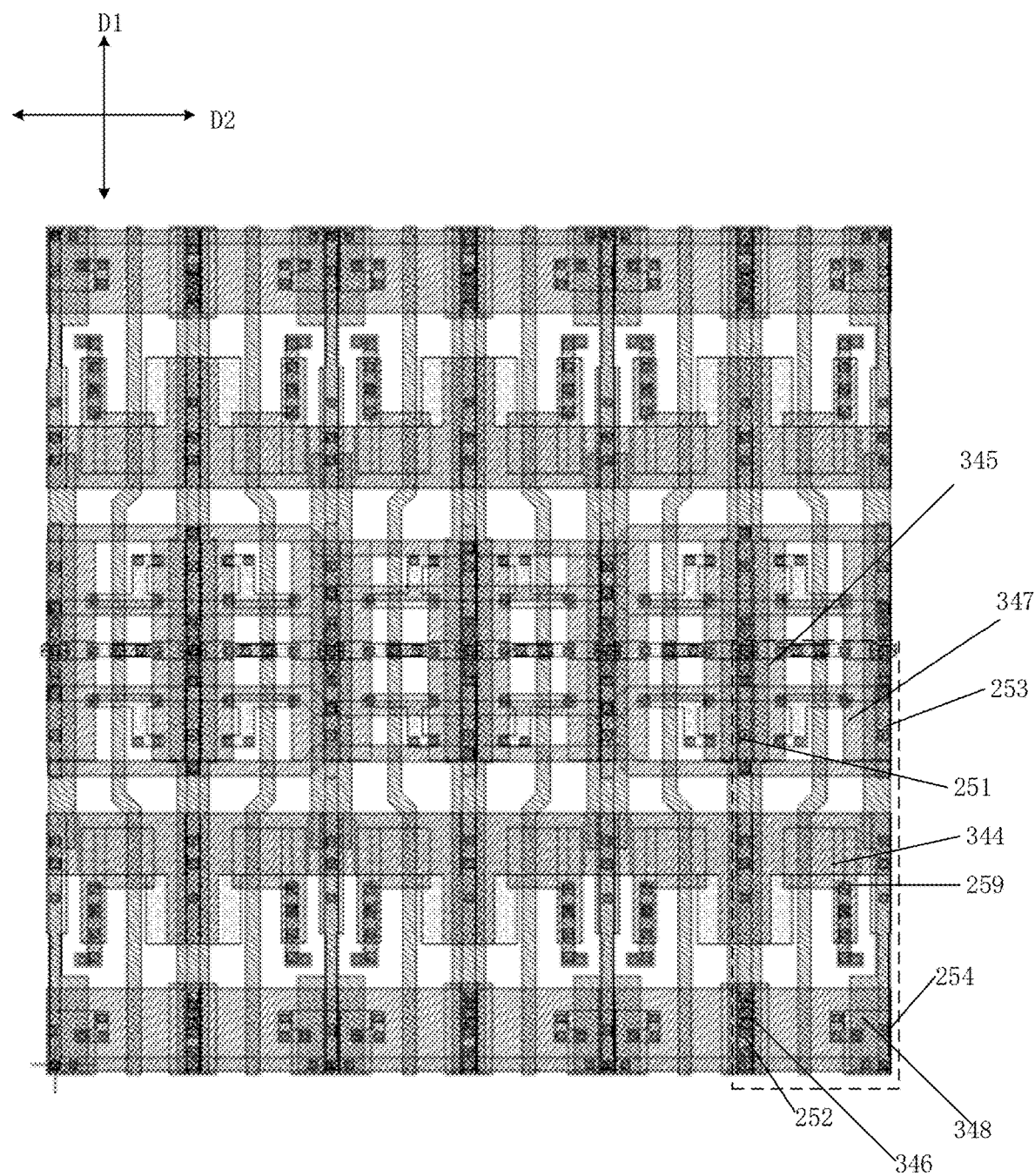

FIG. 9A shows a schematic diagram of a fourth conductive layer 304, FIG. 9B shows the fourth conductive layer 304 on the basis of the third conductive layer 303, and FIG. 9B also shows via holes in the fifth insulating layer 205, The via holes in the fifth insulating layer 205 are used to connect the pattern in the third conductive layer 303 and the pattern in the fourth conductive layer 304. For clarity, only two rows and six columns of sub-pixels are shown in the drawing, and a region of a sub-pixel 100 is shown by a dashed frame. Those skilled in the art may understand that each layer structure before forming the first conductive layer 301 is omitted in FIG. 9B.

As shown in FIGS. 9A and 9B, the fourth conductive layer 304 includes a connecting electrode 344 that is electrically connected to the connecting electrode 334 in the third conductive layer 303 through a via hole 259 in the fifth insulating layer 205, and the connecting electrode 344 is used to be electrically connected to the first electrode 121 of the light-emitting element 120.

In some embodiments, the number of the via hole 249 may be one or more, as shown in FIG. 9B, for example, the number is two, to reduce the contact resistance.

As shown in FIGS. 9A and 9B, the fourth conductive layer 304 includes a connecting electrode 345 and a connecting electrode 346. The connecting electrode 345 and the connecting electrode 346 are electrically connected to the power line 338 in the third conductive layer 303 through a via hole 255 and a via hole 256 in the fifth insulating layer 205, respectively. Both the connecting electrode 345 and the connecting electrode 346 are connected in parallel with the power line 338 in the third electrode layer 303, thereby the transmission resistance of the power line 338 may be reduced, which is beneficial to the transmission of the first power source voltage VDD.

In some embodiments, the connecting electrode 345 and the connecting electrode 346 both have elongated shapes extending along the first direction D1.

In some embodiments, the number of each of the via hole 255 and the via hole 256 may be set to be one or more, as shown in FIG. 9B, for example, the number is two, to reduce the contact resistance.

As shown in FIGS. 9A and 9B, the fourth conductive layer 304 further includes a connecting electrode 347 and a connecting electrode 348. The connecting electrode 347 and the connecting electrode 348 are electrically connected to the grounding line 335 in the third electrode layer 303 through the via hole 257 and the via hole 258 in the fifth insulating layer 205, respectively. Both the connecting electrode 347 and the connecting electrode 348 are connected in parallel with the grounding line 335 in the third electrode layer 303, thereby reducing the transmission resistance of the grounding line 335, which is beneficial to the transmission of the first power source voltage VDD.

In some embodiments, the connecting electrode 347 and the connecting electrode 348 both have elongated shapes extending in the first direction D1.

In some embodiments, the number of each of the via hole 257 and the via hole 258 may be set to one or more, as shown in FIG. 9B, for example, the number is two, to reduce the contact resistance.

For example, each via hole may be additionally filled with a conductive material (such as tungsten) for conduction.

FIG. 9B also shows a contact hole region 349 of the connecting electrode 344, and the contact hole region 349 is used for electrical connection with the first electrode 121 of the light-emitting element 120. In some embodiments, for example, as shown in FIG. 3B, the display panel 10 further includes a sixth insulating layer 206, and the contact hole region 349 corresponding to the connecting electrode 344 in the sixth insulating layer 206 is formed with a via hole 267 for electrically connecting the subsequent first electrode 121, for example, an anode of the light-emitting element 120. The via hole 267 is also called an anode via hole 267. The via hole 267 is filled with a conductive material (such as tungsten), and then undergoes a polishing process (such as chemical mechanical polishing) to form a flat surface, which is used to form the light-emitting element 120.

Referring to FIGS. 3B-9B in conjunction, an orthographic projection of the anode via hole 267 on the base substrate 101 at least partially overlaps with the orthographic projection of the first capacitor electrode 141 on the base substrate 101. The orthographic projection of the anode via hole 267 on the base substrate 101 at least partially overlaps with the orthographic projection of the third capacitor electrode 315 on the base substrate 101. Such design may avoid excessively high step difference at the anode via hole, and may ensure an electrical connection effect between the contact hole region 349 and the first electrode 121 of the light-emitting element 120, for example, the anode.

In some embodiments, the number of the via hole 267 is at least two.

For example, as shown in FIG. 3B, the number of the contact hole regions for electrical connection on the connecting electrodes 314, 324, 334, and 344 connected to the first electrode 121 of the light-emitting element 120 may be one or more, which reduces a contact resistance among the connecting electrodes, and thereby reducing the contact resistance between the resistor R and the first electrode 121 of the light-emitting element 120, thereby reducing a voltage drop on a transmission path of the data signal from the resistor R to the first electrode 121. It reduces the color shift, display unevenness and other problems caused by an anode potential loss (gray scale loss) caused by the voltage drop, and improves the display effect.

As shown in FIG. 3B, the light-emitting element 120 includes a first electrode 121, a light-emitting layer 123, and a second electrode 122 sequentially arranged on the sixth insulating layer 206. For example, the first electrode 121 and the second electrode 122 are an anode and a cathode of the OLED, respectively. For example, a plurality of first electrodes 121 are arranged at intervals in the same layer, and correspond to the plurality of sub-pixels one-to-one. For example, the second electrode 122 is a common electrode, and an entire surface thereof is arranged in the display panel 10.

In some embodiments, as shown in FIG. 3B, the display panel further includes a first encapsulation layer 124, a color film layer 125, a cover plate 126, etc. that are located on a side of the light-emitting element 120 away from the base substrate 101.

For example, the first encapsulation layer 124 is configured to seal the light-emitting element to prevent external moisture and oxygen from permeating the light-emitting element and the pixel circuit and causing damage to the device. For example, the encapsulation layer 124 includes an organic thin film or a structure in which an organic thin film and an inorganic thin film are alternately stacked. For example, a water-absorbing layer may be provided between the encapsulation layer 124 and the light-emitting element. The water-absorbing layer is configured to absorb water in the light-emitting element generated in a pre-fabrication.

In some embodiments, as shown in FIG. 3B, the display panel may further include a second encapsulation layer 127 located between the color film layer 125 and the cover plate 126, and the second encapsulation layer 127 may protect the color film layer 125.

For example, the light-emitting element 120 is configured to emit white light, and the color film layer 124 is combined to achieve a full-color display.

In other examples, the light-emitting element 120 is configured to emit light of three primary colors, and the color film layer 124 is not necessary in this case. The embodiments of the present disclosure do not limit the manner in which the display panel 10 achieves full-color display.

In some embodiments, the material of the first to the fourth conductive layers is a metal material, such as gold (Au), silver (Ag), copper (Cu), aluminum (Al), molybdenum (Mo), magnesium (Mg)), tungsten (W), and an alloy material combined with the above metals. For example, the material of the first to the fourth conductive layers may also be a conductive metal oxide material, such as indium tin oxide (ITO), indium zinc oxide (IZO), zinc oxide (ZnO), zinc aluminum oxide (AZO), and the like.

In some embodiments, the material of the first to the sixth insulating layers is, for example, an inorganic insulating layer, such as silicon oxide, silicon nitride, silicon oxynitride, etc., silicon nitride or silicon oxynitride, or an insulating material containing metal oxynitride such as aluminum oxide, titanium nitride, etc.

In some embodiments, the light-emitting element 120 has a top emission structure, the first electrode 121 is reflective and the second electrode 122 is transmissive or semi-transmissive. For example, the first electrode 121 is a high work function material, such as an ITO/Ag/ITO laminate structure, so as to be used as an anode; the second electrode 122 is a low work function material, such as a semi-transmissive metal or metal alloy, for example, an Ag/Mg alloy material, so as to be used as a cathode.

Figure 10:
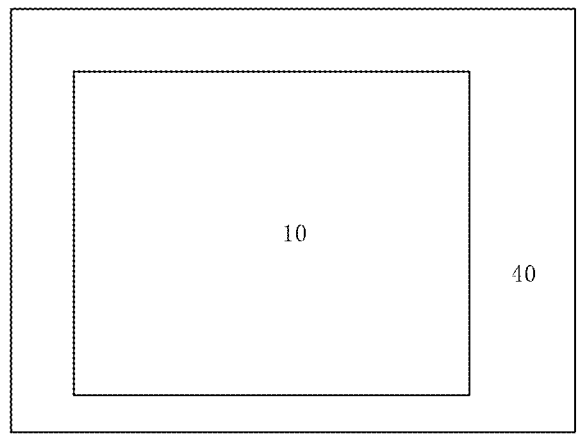
FIG. 10 is a schematic diagram of a display device provided by an embodiment of the disclosure.

Some embodiments of the present disclosure also provide a display device 40. As shown in FIG. 10, the display device 40 includes any display panel 10 described above. The display device in the embodiments of the present disclosure may be: a display, an OLED panel, an OLED television, an E-paper, a mobile phone, a tablet computer, a laptop computer, a digital photo frame, a navigator and other products or components with display function.

The above descriptions are only preferred embodiments of the present disclosure and an explanation of the applied technical principles. Those skilled in the art should understand that the scope involved in the present disclosure is not limited to the technical solutions formed by the specific combination of the above technical features, and should also cover the technical solutions based on the above technical features or other technical solutions formed by any combination of the equivalent features without departing from the inventive concept, for example, the technical solution formed by replacing the above-mentioned features with the technical features disclosed in the present disclosure (but not limited to) having similar functions.

What is claimed is:

1. A display panel, comprising:
a base substrate and a sub-pixel on the base substrate, wherein the sub-pixel comprises a pixel circuit and a light emitting element, the pixel circuit comprises a data writing sub-circuit, a storage sub-circuit and a driving sub-circuit;
wherein the data writing sub-circuit is configured to transmit a data signal to the storage sub-circuit in response to a control signal;
wherein the driving sub-circuit comprises a control electrode, a first electrode and a second electrode, the control electrode of the driving sub-circuit is coupled to the storage sub-circuit, the first electrode of the driving sub-circuit is configured to receive a first power source voltage, the second electrode of the driving sub-circuit is coupled to a first electrode of the light emitting element, and the driving sub-circuit is configured to drive the light emitting element to emit light in response to a voltage of the control electrode of the driving sub-circuit;
wherein the storage sub-circuit comprises a storage capacitor, the storage capacitor comprises a first capacitor electrode and a second capacitor electrode opposite to the first capacitor electrode, the first capacitor electrode and the second capacitor electrode are respectively configured as a first terminal of the storage sub-circuit and a second terminal of the storage sub-circuit, the second capacitor electrode is located between the base substrate and the first capacitor electrode, the second capacitor electrode comprises a first region, a second region and a third region that are arranged in a short side direction of the sub-pixel in sequence, a carrier mobility in the second region is different from a carrier mobility in the first region and a carrier mobility in the third region, and an area of the second region is larger than an area of the first region and an area of the third region;
wherein the control electrode of the driving sub-circuit and the first capacitor electrode are disposed in the same layer and are a continuous integral structure; and
wherein the data writing sub-circuit, the storage sub-circuit and the driving sub-circuit are sequentially arranged along a direction parallel to the base substrate and perpendicular to the short side direction of the sub-pixel.

2. The display panel according to claim 1, wherein the pixel circuit further comprises a resistor, the resistor is connected in series between the second electrode of the driving sub-circuit and the first electrode of the light emitting element, the resistor and the driving electrode of the driving sub-circuit are disposed in the same layer and spaced from each other, and a resistivity of the resistor is higher than a resistivity of the control electrode of the driving sub-circuit.

3. The display panel according to claim 2, wherein the data writing sub-circuit comprises a transmission gate circuit, the transmission gate circuit comprises a first data writing transistor and a second data writing transistor, each of the first data writing transistor and the second data writing transistor comprises a gate electrode, a first electrode and a second electrode, the control signal comprises a first control signal and a second signal;
wherein the gate electrode of the first data writing transistor is configured to receive the first control signal, the gate electrode of the second data writing transistor is configured to receive the second control signal, the first electrode of the first data writing transistor is coupled to the first electrode of the second data writing transistor, and each of the first electrode of the first data writing transistor and the first electrode of the second data writing transistor is coupled to the first terminal of the storage sub-circuit and the control electrode of the driving sub-circuit, the second electrode of the first data writing transistor is coupled to the second electrode of the second data writing transistor, and each of the second electrode of the first data writing transistor and the second electrode of the second data writing transistor is configured to receive the data signal.

4. The display panel according to claim 3, wherein the driving sub-circuit comprises a driving transistor, a gate electrode of the driving transistor, a first electrode of the driving transistor, and a second electrode of the driving transistor are configured as the control electrode of the driving sub-circuit, the first electrode of the driving sub-circuit, and the second electrode of the driving sub-circuit, respectively.

5. The display panel according to claim 4, wherein each of the first data writing transistor and the driving transistor is an N-type metal oxide semiconductor field effect transistor, and the second data writing transistor is a P-type metal oxide semiconductor field effect transistor.

6. The display panel according to claim 5, wherein the transmission gate circuit and the driving transistor are respectively located on both sides of the storage capacitor in a first direction parallel to the base substrate.

7. The display panel according to claim 6, wherein the resistor and the driving transistor are located on the same side of the storage capacitor in the first direction parallel to the base substrate.

8. The display panel according to claim 7, wherein a minimum distance between a channel of the driving transistor and the first data writing transistor is greater than a minimum distance between the channel of the driving transistor and the second data writing transistor;
wherein a minimum distance between the resistor and the first data writing transistor is smaller than a minimum distance between the resistor and the second data writing transistor;
wherein in a second direction parallel to the base substrate and perpendicular to the first direction, the second data writing transistor and the first data writing transistor are arranged in sequence and the driving transistor and the resistor are arranged in sequence, wherein the second direction is the short side direction of the sub-pixel.

9. The display panel according to claim 8, wherein the resistor has an elongated shape extending in the first direction, and the resistor is located on a side of the second electrode of the driving transistor away from the driving transistor;
wherein a width of the resistor is smaller than a width of one of the gate electrode of the first data writing transistor, the gate electrode of the second data writing transistor, and the gate electrode of the driving transistor.

10. The display panel according to claim 5, wherein the gate electrode of the driving transistor, the gate electrode of the first data writing transistor, the gate electrode of the second data writing transistor, the first capacitor electrode, and the resistor are disposed in the same layer.

11. The display panel according to claim 5, wherein the storage capacitor further comprises a third capacitor electrode, the third capacitor electrode is located on a side of the first capacitor electrode away from the second capacitor electrode in a direction perpendicular to the base substrate, and the third capacitor electrode is coupled to the first region of the second capacitor electrode through a first via hole;
wherein an orthographic projection of the third capacitor electrode on the base substrate falls within an orthographic projection of the second capacitor electrode on the base substrate, and the orthographic projection of the third capacitor electrode on the base substrate partially overlaps with an orthographic projection of the first capacitor electrode on the base substrate.

12. The display panel according to claim 11, wherein the display panel further comprises a grounding line configured to couple the first region and the third region of the second capacitor electrode, so that the first region and the third region of the second capacitor electrode input a grounding voltage, the grounding line is located on a side of the third capacitor electrode away from the second capacitor electrode in the direction perpendicular to the base substrate, and an orthographic projection of the grounding line on the base substrate partially overlaps with the orthographic projection of the third capacitor electrode on the base substrate.

13. The display panel according to claim 8, wherein the second data writing transistor and the first data writing transistor are disposed side by side along the second direction, and are arranged symmetrically with respect to a symmetric axis in the first direction.

14. The display panel according to claim 5, wherein the display panel comprises four said sub-pixels, and the four sub-pixels constitute a pixel unit group;
wherein the four sub-pixels are arranged in a first direction and a second direction as an array, and the first direction is perpendicular to the second direction; and
wherein orthographic projections of second data writing transistors of the four sub-pixels on the base substrate fall within one N-type well region in the base substrate.

15. The display panel according to claim 14, wherein resistors of the sub-pixels adjacent in the first direction are arranged symmetrically with respect to a symmetric axis in the second direction, and resistors of the sub-pixels adjacent in the second direction are arranged symmetrically with respect to a symmetric axis in the first direction;
wherein transmission gate circuits of two sub-pixels adjacent in the first direction are arranged symmetrically with respect to a symmetric axis in the second direction, and transmission gate circuits of two sub-pixels adjacent in the second direction are arranged symmetrically with respect to a symmetric axis in the first direction;

wherein driving transistors of the two sub-pixels adjacent in the first direction are arranged symmetrically with respect to a symmetric axis in the second direction, and driving transistors of the two sub-pixels adjacent in the second direction are arranged symmetrically with respect to a symmetric axis in the first direction;

wherein first capacitor electrodes of the sub-pixels adjacent in the first direction are arranged symmetrically with respect to a symmetric axis in the second direction, and first capacitor electrodes of the sub-pixels adjacent in the second direction are arranged symmetrically with respect to a symmetric axis in the first direction.

16. The display panel according to claim 15, wherein orthographic projections of the first capacitor electrodes of the four sub-pixels on the base substrate are located outside the N-type well region, and are disposed surrounding the N-type well region.

17. The display panel according to claim 11, wherein a part of the third capacitor electrode close to the first region of the second capacitor electrode has a width in the first direction being greater than a width in the first direction of a part of the third capacitor electrode close to the third region of the second capacitor electrode;

wherein the sub-pixel further comprises an anode via hole configured to connect the pixel circuit and the light emitting element, and an orthographic projection of the anode via hole on the base substrate at least partially overlaps with the orthographic projection of the first capacitor electrode on the base substrate;

wherein the sub-pixel further comprises an anode via hole configured to connect the pixel circuit and the light emitting element, and an orthographic projection of the anode via hole on the base substrate at least partially overlaps with the orthographic projection of the third capacitor electrode on the base substrate.

18. The display panel according to claim 1, wherein the pixel circuit further comprises:

a connecting electrode configured to couple the data writing sub-circuit and the first capacitor electrode of the storage capacitor, wherein the connecting electrode is coupled to the first capacitor electrode through a second via hole, and a distance between the second via hole and the first region is smaller than a distance between the second via hole and the third region.

19. The display panel according to claim 11, wherein a distance between the first via hole and the driving transistor is smaller than a distance between the first via hole and the data writing sub-circuit;

wherein the orthographic projection of the first capacitor electrode on the base substrate and the orthographic projection of the second capacitor electrode on the base substrate have an overlapped region, and the overlapped region comprises a first protrusion protruding toward the driving transistor and a second protrusion protruding toward the first data writing transistor.

20. A display device, comprising the display panel according to claim 1.

* * * * *